(12) United States Patent
Maguire

(10) Patent No.: US 10,394,373 B2
(45) Date of Patent: Aug. 27, 2019

(54) ACTIVE MATRIX TOUCH PANEL WITH NARROW BEZEL

(71) Applicant: Sharp Kabushiki Kaisha, Osaka (JP)

(72) Inventor: Sean Thomas George Maguire, Oxford (GB)

(73) Assignee: SHARP KABUSHIKI KAISHA, Osaka (JP)

(*) Notice: Subject to any disclaimer, the term of this patent is extended or adjusted under 35 U.S.C. 154(b) by 18 days.

(21) Appl. No.: 15/782,947

(22) Filed: Oct. 13, 2017

(65) Prior Publication Data

US 2019/0114018 A1   Apr. 18, 2019

(51) Int. Cl.
*G06F 3/041* (2006.01)
*G06F 3/044* (2006.01)
*H01L 27/32* (2006.01)

(52) U.S. Cl.
CPC ............ *G06F 3/0416* (2013.01); *G06F 3/044* (2013.01); *G06F 3/0412* (2013.01); *G06F 3/0444* (2019.05); *G06F 3/0445* (2019.05); *G06F 3/0446* (2019.05); *G06F 2203/04111* (2013.01); *H01L 27/323* (2013.01); *H01L 27/3262* (2013.01); *H01L 27/3276* (2013.01)

(58) Field of Classification Search
CPC ...... G06F 3/0416; G06F 3/0412; G06F 3/044; G06F 2203/04104; G02F 1/13338
See application file for complete search history.

(56) References Cited

U.S. PATENT DOCUMENTS 5,841,078 A   11/1998   Bisset et al.
6,323,846 B1 *  11/2001   Westerman ........... G06F 3/0235
                                                                                          345/173

(Continued)

FOREIGN PATENT DOCUMENTS

GB         2542854 A    4/2017
WO    WO 2017/056900 A1   4/2017

OTHER PUBLICATIONS

Zhi et al., "High Precision Active-Matrix Self-Capacitive Touch Panel Based on Fluorinated ZnO Thin-Film Transistor", Journal of Display Technology, vol. 11, No. 1 (Year: 2015).*

*Primary Examiner* — Sardis F Azongha
(74) *Attorney, Agent, or Firm* — Renner, Otto, Boisselle & Sklar, LLP

(57) ABSTRACT

A capacitive sensing array includes an array of electrodes; first conductive data lines arranged in a first direction and second conductive data lines arranged in a second direction different from the first direction; first switching elements configured to connect each electrode to a first conductive line in the first direction, and second switch elements configured to connect each electrode to a second conductive line in the second direction; and control lines connected to the first and second switching elements. Electrical connections are present between each first conductive data line in the first direction and a second conductive data line in the second direction such that each first conductive line in the first direction is connected to at least one second conductive line in the second direction. A touch panel display device includes the capacitive sensing array implemented as an active matrix touch sensor panel integrated with a display, and a controller that applies drive signals and measures capacitance during different time periods.

19 Claims, 19 Drawing Sheets

(56) References Cited

U.S. PATENT DOCUMENTS

| | | | |
|---|---|---|---|
| 8,217,913 B2* | 7/2012 | Hotelling | G06F 3/0412 345/173 |
| 8,698,775 B2* | 4/2014 | Huang | G06F 3/0416 345/173 |
| 9,086,774 B2* | 7/2015 | Hotelling | G06F 3/0412 |
| 9,105,255 B2 | 8/2015 | Brown et al. | |
| 9,250,735 B2 | 2/2016 | Kim et al. | |
| 9,448,675 B2* | 9/2016 | Morein | G06F 3/044 |
| 9,645,675 B2* | 5/2017 | Ye | G06F 3/044 |
| 10,032,061 B2* | 7/2018 | Chia | G06F 3/04886 |
| 2009/0256815 A1* | 10/2009 | Westerinen | G06F 3/044 345/174 |
| 2010/0001973 A1 | 1/2010 | Hotelling et al. | |
| 2011/0050585 A1* | 3/2011 | Hotelling | G06F 3/0412 345/173 |
| 2012/0319992 A1* | 12/2012 | Lee | G06F 3/044 345/174 |
| 2014/0132559 A1 | 5/2014 | Kim | |
| 2015/0130747 A1* | 5/2015 | Tsai | G06F 3/0412 345/174 |
| 2016/0320886 A1* | 11/2016 | Kim | G06F 3/0412 |
| 2016/0364068 A1* | 12/2016 | Cheng | G06F 3/0416 |
| 2017/0102826 A1* | 4/2017 | Hamaguchi | G06F 3/044 |
| 2017/0139523 A1* | 5/2017 | Chang | G06F 3/0416 |
| 2018/0203540 A1 | 7/2018 | Maguire et al. | |

\* cited by examiner

ACTIVE MATRIX TOUCH PANEL WITH NARROW BEZEL

TECHNICAL FIELD AND APPLICATIONS OF THE INVENTION

The present invention relates to capacitive sensing arrays. In particular, this invention relates to capacitive type touch panels. Such a capacitive type touch panel device may find application in a range of consumer electronic products including, for example, mobile phones, tablet and desktop PCs, electronic book readers and digital signage products.

BACKGROUND ART

Touch panels have become widely adopted as the input device for a range of electronic products such as smartphones and tablet devices.

Most high-end portable and handheld electronic devices now include touch panels. These are most often used as part of a touchscreen, i.e., a display and a touch panel that are aligned so that the touch zones of the touch panel correspond with display zones of the display.

The most common user interface for electronic devices with touchscreens is an image on the display, the image having points that appear interactive. More particularly, the device may display a picture of a button, and the user can then interact with the device by touching, pressing or swiping the button with their finger or with a stylus. For example, the user can "press" the button and the touch panel detects the touch (or touches). In response to the detected touch or touches, the electronic device carries out some appropriate function. For example, the electronic device might turn itself off, execute an application, or the like.

Although a number of different technologies can be used to create touch panels, capacitive systems have proven to be the most popular due to their accuracy, durability and ability to detect touch input events with little or no activation force.

A well-known approach to capacitive sensing applied to touch panels is the projected capacitive approach. This approach includes the mutual-capacitance method and the self-capacitance method.

In the mutual-capacitance method, as shown in FIG. 1, a drive electrode 100 and sense electrode 101 are formed on a transparent substrate (not shown). A changing voltage or excitation signal is applied to the drive electrode 100 from a voltage source 102. A signal is then generated on the adjacent sense electrode 101 by means of capacitive coupling via the mutual coupling capacitor 103 formed between the drive electrode 100 and sense electrode 101. A current measurement unit or means 104 is connected to the sense electrode 101 and provides a measurement of the size of the mutual coupling capacitor 103. When the input object 105 (such as a finger or stylus) is brought into close proximity to both electrodes, it forms a first dynamic capacitor to the drive electrode 106 and a second dynamic capacitor to the sense electrode 107.

If the input object is connected to ground, as is the case for example for a human finger connected to a human body, the effect of these dynamically formed capacitances is manifested as a reduction of the amount of capacitive coupling between the drive and sense electrodes and hence a reduction in the magnitude of the signal measured by the current measurement unit or means 104 attached to the sense electrode 101.

In the self-capacitance method, as shown in FIG. 2, a drive electrode 200 is formed on a transparent substrate (not shown). A changing voltage or excitation signal is applied to the drive electrode 200 from a voltage source 201. A current measurement means 202 is connected to the electrode 200 and provides a measurement of the size of the self-capacitance 203 of the electrode to ground. When the input object 105 is brought into close proximity to the electrode, it changes the value of the self-capacitance 203. If the input object is connected to ground, as is the case for example of a human finger connected to a human body, the effect is to increase the self-capacitance of the electrode to ground 203 and hence to increase the magnitude of the signal measured by the current measurement means 202 attached to the sense electrode 200.

As is well-known and disclosed, for example, in U.S. Pat. No. 5,841,078 (Bisset et al, issued Oct. 30, 1996), by arranging a plurality of drive and sense electrodes in a grid pattern to form an electrode array, the mutual-capacitance sensing method may be used to form a touch panel device. FIG. 3 shows a suitable pattern of horizontal electrodes 300 that may be configured as drive electrodes, and vertical electrodes 301 that may be configured as sense electrodes. An advantage of the mutual-capacitance sensing method is that multiple simultaneous touch input events may be detected.

It is also well-known and disclosed, for example, in U.S. Pat. No. 9,250,735 (Kim et al, issued Feb. 2, 2016), that by arranging a plurality of electrodes in a two dimensional array, and by providing an electrical connection from each electrode to a controller, the self-capacitance sensing method may be used to form a touch panel device that is able to reliably detect simultaneous touches from multiple objects.

FIG. 4 shows one example of such a two dimensional electrode array forming a touch sensor panel. This array includes twelve square electrodes 400 formed on a first layer, with four electrodes arranged in a first direction and three electrodes arranged in a second direction. Vias 401 connect each electrode 400 on the first layer to connecting lines 402 on a second layer. By this means, each electrode 400 is separately connected to a controller by connecting lines 402. The first column of electrodes is connected by connecting lines 404, the second column is connected by connecting lines 405, and the third column is connected by means of connecting lines 406.

In many touch screens the touch panel is a device independent of the display, known as an "out-cell" touch panel. The touch panel is positioned on top of the display, and the light generated by the display crosses the touch panel, with an amount of light being absorbed by the touch panel. In more recent implementations, part of the touch panel is integrated within the display stack, and touch panel and display may share the use of certain structures, such as transparent electrodes. This is known as an "in-cell" touch panel. This integration of the touch panel into the display structure seeks to reduce cost by simplifying manufacture, as well as reducing the loss of light throughput that occurs when the touch panel is independent of the display and located on top of the display stack.

These two approaches are illustrated in FIG. 5A and FIG. 5B. FIG. 5A shows a schematic view of a cross section 500 of an example out-cell touch screen, i.e. a combination of display and touch panel. The touch panel 501 and display 502 are physically separated, and typically the touch panel may be located below the cover glass, although the order and arrangement of the layers may be different. Touch panel controller 503 and display driver 504 control the touch panel and display functionalities respectively, and they are both controlled by the panel processor 505. Alternatively, as shown in cross section 506 of FIG. 5B, the display and touch sensor may be integrated in the same layer 507, which is sandwiched between the other display layers. This is an in-cell touch panel.

GB2542854A (Brown et al, published Apr. 5, 2017) discloses a type of in-cell touch panel that uses the VCOM layer of the display to form touch panel electrodes, which are connected to driving and sensing circuits by an active matrix of TFTs. This structure achieves the benefits of an in-cell touch panel, particularly lower cost and thickness. Compared with a conventional in-cell touch panel, it generally requires fewer connections between the panel and the controller. The electrode size and shape is also reconfigurable, and it can be used with mutual-capacitance and self-capacitance sensing.

FIG. 6 shows an embodiment described in GB2542854A. Two touch unit cells 600 and 601 influence each other through their mutual capacitance 605. These touch unit cells are also influenced by the presence of an object, in this case a human finger 606, through the capacitances 603 and 604 respectively.

On touch unit cell 600, capacitances 603 and 605 are connected at the common node 650, which is a conductive element joining the conductive plates of capacitances 603 and 605 to the active matrix circuit. Electronic switches (for example, transistors such as TFTs in FIGS. 6) 620 and 621 are used to select which of the data lines 640 and 641 are connected to common node 650. This selection depends on the voltage present at the gate nodes 630 and 631, as controlled by respective control lines 610, 611. When gate 630 is in a high state, transistor 620 connects data line 641 with common node 650. When gate 631 is in a high state, transistor 621 connects data line 640 with common node 650.

On touch unit cell 601, capacitances 604 and 605 are connected at the common node 651, which is a conductive element joining the conductive plates of capacitances 605 and 604 to the active matrix circuit. Transistors 622 and 623 are used to select which of the data lines 642 and 643 are connected to common node 651. This selection depends on the voltage present at the gate nodes 632 and 633, as controlled by respective control lines 612, 613. When gate 632 is in a high state, transistor 622 connects data line 643 with common node 651. When gate 633 is in a high state, transistor 623 connects data line 642 with common node 651. Transistor gates 630, 631, 632 and 633 are actuated by means of control lines 610, 611, 612 and 613 respectively.

As will be understood, each touch unit cell has two control lines and two data lines. Touch unit cell 600 has two control lines 610, 611 and two data lines 640, 641, whereas touch unit cell 601 has two control lines 612, 613 and two data lines 642, 643. In this embodiment the two control lines and one data line 640 (or 642) extend generally along the row direction and the other data line 641 (or 643) extends generally along the column direction, but the invention of GB2542854A is not limited to this configuration for the control lines and data lines.

The control lines 610, 611 (612, 613) of FIG. 6 and the data lines 640, 641 (642, 643) of FIG. 6 implement touch functionality, and so may be considered as "touch control lines" and "touch data lines" respectively. It should be understood however that referring to, for example, a data line as a "touch data line" does not necessarily mean that that data line implements only touch functionality—in some embodiments of GB2542854A a data line may be used to implement both touch functionality and display functionality, and in principle a control line may be used to implement both touch functionality and display functionality.

The data lines 640, 641 (642,643) are connected to respective drive circuits (not shown) for supplying drive signals to the data lines, or sensing circuits (not shown). In a typical embodiment of GB2542854A the data line 641 (643) that extends generally along the column direction is connected to a sensing circuit, although other embodiments are also possible. The data line 641 may therefore also be considered as a "sensing data line" (or "sensing/drive data line") and the data line 640 may be considered as a "drive data line". The drive circuit and the drive/sensing circuits may conveniently be constituted in the touch panel controller.

In some embodiments, the basic unit cell structure of the active matrix touch panel may include more than two TFTs. For example, a third TFT may be used to amplify the sense signal.

FIG. 7 shows one embodiment of an in-cell active matrix touch sensor panel as described in GB2542854A. In this embodiment there are nine touch sensitive electrodes 700. Other embodiments may have a different number of electrodes. Each electrode 700 is connected to two TFTs 701. Each electrode and pair of TFTs may comprise several unit cells (such as those shown in FIG. 6) connected in parallel. The "SEL1" gate control line 702 controls the state of the TFTs connecting electrodes in the first row to the vertical "SEN" touch data lines 711-713. The "SEL2" gate control line 705 controls the state of the TFTs connecting electrodes in the second row to the vertical "SEN" touch data lines 711-713. The "SEL3" gate control line 708 controls the state of the TFTs connecting electrodes in the third row to the vertical "SEN" touch data lines 711-713. The "SELB1" gate control line 703 controls the state of the TFTs connecting electrodes in the first row to the horizontal "FNC1" touch data line 704. The "SELB2" gate control line 706 controls the state of the TFTs connecting electrodes in the second row to the horizontal "FNC2" touch data line 707. The "SELB3" gate control line 709 controls the state of the TFTs connecting electrodes in the third row to the horizontal "FNC3" touch data line 710.

Control signals may be applied to the control lines 702, 703, 705, 706, 708 and 709 to configure the connections between the electrodes 700 and the touch data lines 704, 707, 710, 711, 712 and 713. In this embodiment, the touch data lines 704, 707, 710, 711, 712 and 713 may be connected to a touch panel controller. For example, horizontal touch data lines 704, 707 and 710 may be used to apply drive signals to one or more rows of electrodes, and vertical touch data lines 711, 712 and 713 may be used to sense the charge on one or more electrodes in one or more columns.

However, a limitation of the structure disclosed in GB2542854A is that several connecting lines are required, including control lines and touch data lines. The control lines cannot easily be shared with the display. These extra lines may be routed in the panel bezel, but routing a large number of lines in the bezel is not desirable as it may increase the width of the bezel area. Alternatively the control lines may be routed within the display active area. However, this is not desirable because it reduces the pixel aperture and thus the efficiency and brightness of the display.

The touch data lines may also be separate from the display, in which case the same problems are encountered with routing them in the bezel or the active area. Alternatively, the touch data lines may be shared with the display data lines. However, this may not be possible due to the requirements of the display and the display driving electronics.

WO2017056900A1 (Hamaguchi et al, published Apr. 6, 2017) discloses a method of driving an active matrix touch panel structure, such as that disclosed in GB2542854A, with an orthogonal drive code in order to make self-capacitance measurements with a high signal to noise ratio. For example, drive signals corresponding to different orthogonal drive codes may be applied to the electrodes in each row via the horizontal touch data lines, and the total charge on the electrodes in each column may be sensed by charge amplifiers via the vertical touch data lines. By making a series of measurements and decoding the signal from each of the orthogonal drive codes, the self-capacitance of each electrode may be measured. However, this requires the same control and data lines as GB2542854A.

A limitation of typical capacitance measurement techniques as conventionally applied to touch panels is that they are incapable of detecting input from non-conductive or insulating objects, for example made of wood, plastic or the like.

U.S. Pat. No. 9,105,255 (Brown et al, issued Aug. 11, 2015) discloses a type of mutual-capacitance touch panel that is able to detect non-conductive objects, and to distinguish whether an object is conductive or non-conductive. This is achieved by measuring multiple mutual capacitances formed over different coupling distances. The type of object (conductive or non-conductive) can be determined based on the changes in the multiple mutual capacitances. The multiple mutual capacitances are formed between an array of row and column electrodes.

SUMMARY OF THE INVENTION

The present invention relates to an active matrix capacitive sensing array, and a controller and method of driving the array. The active matrix capacitive sensing array may be an active matrix touch sensor panel that may be used, for example, in touch panel display systems or the like. The active matrix touch sensor panel may be integrated with a display.

An active matrix capacitive sensing array or touch sensor panel comprises an array of electrodes, horizontal and vertical data lines, switching elements within the array area (such as TFTs) that can connect each electrode to a horizontal data line or to a vertical data line, and control lines that can control the state of the switching elements. The horizontal data lines may be used, for example, to drive the electrodes, and the vertical data lines may be used, for example, to sense the electrodes.

The present invention provides for a novel capacitive sensing array structure, and a method of driving the array, in order to reduce the number of connections that are made to the array. For example, this can reduce the number of such connections that are routed in the bezel area of an active matrix touch sensor panel.

A connection is made between each of the data lines in the first direction and at least one data line in the second direction. For example, each horizontal data line may be connected to a vertical data line, such that every horizontal data line is connected to a different vertical data line. The function of the connected horizontal and vertical data lines may then be time-multiplexed between different functions, for example drive and sense. This time-multiplexing may be achieved by using a set of multiplexing switches, such as TFTs or CMOS transistors, to make different connections to the data lines. In this way, every electrode may be connected to a drive signal source, and may subsequently be connecting to a sense amplifier.

Furthermore, the control lines of the capacitive sensor array may be grouped together into a small number of common control lines in order to further reduce the number of connections.

A control signal generator supplies control signals to the control lines and the multiplexing switches in order to configure the system and perform functions such as driving and sensing.

By applying drive voltages to the electrodes, and subsequently measuring the charge stored on each electrode, the capacitance of each electrode can be determined. These capacitance measurements can be used, for example, to determine the location of objects touching an active matrix touch sensor panel.

The same drive signal may be applied to several electrodes, for example a row of electrodes connected to the same horizontal data line, and several electrodes may subsequently be measured by the same sense amplifier, for example a column of electrodes connected to the same vertical data line. By using a set of orthogonal drive signals, the capacitance of each electrode can still be determined.

DETAILED DESCRIPTION OF INVENTION

Figure 8:
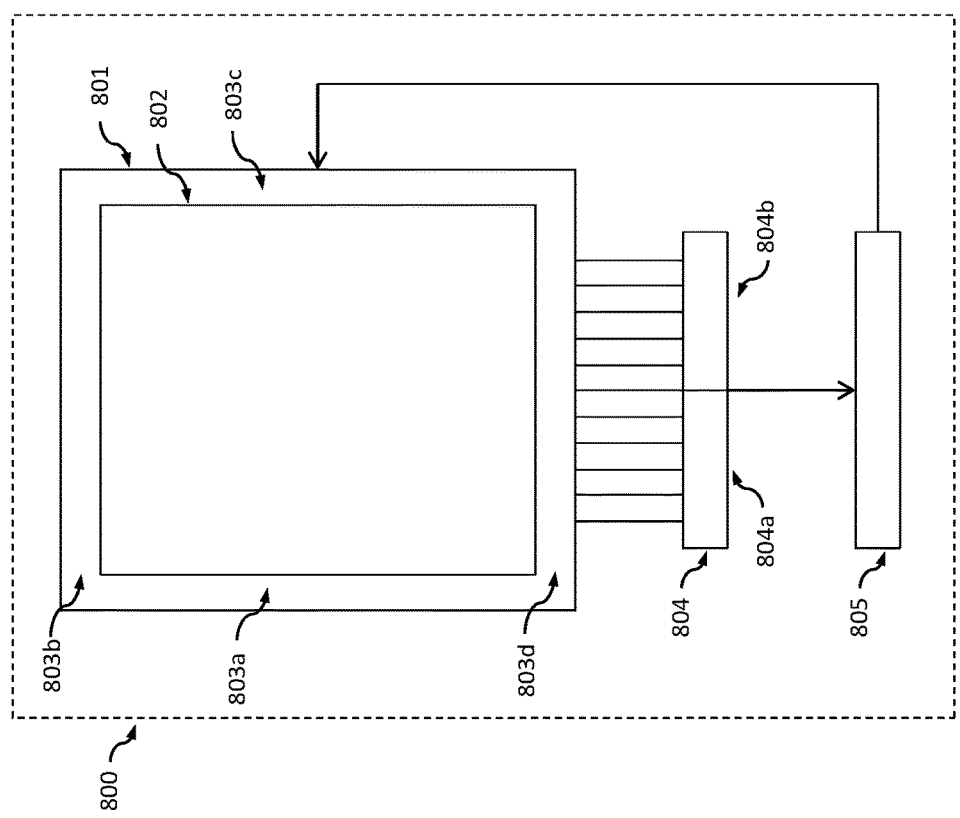
FIG. 8 shows a touch panel display system including an active matrix touch sensor panel integrated with a display.

The present invention provides a capacitive sensing array, and a controller and method of driving the array. The capacitive sensing array may be a capacitive touch sensor that may be used, for example, in touch panel display systems or the like. FIG. 8 shows one embodiment of such a touch panel display system 800. This system includes an integrated display and active matrix touch sensor panel 801.

The integrated display and active matrix touch sensor panel 801 includes an active area 802, and may also include a bezel area 803. The touch panel and/or display may not function in the bezel area, or may have reduced functionality. Part or all of the bezel area may be used to route connecting lines such as metal traces, to accommodate useful structures such as TFTs, or for other purposes. The bezel area may include one or more of a left bezel 803a, a top bezel 803b, a right bezel 803c and a lower bezel 803d.

Figure 1:
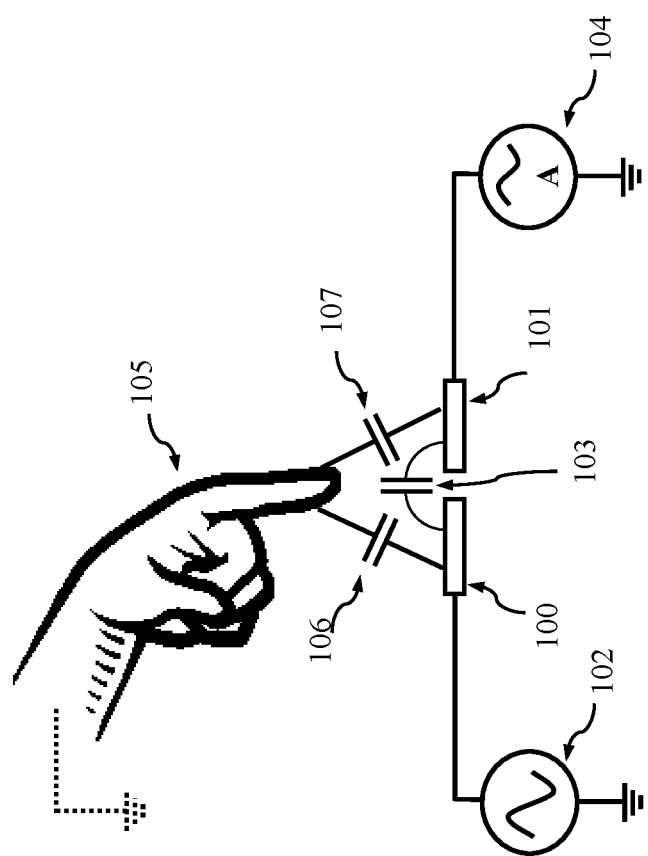
FIG. 1 shows a typical implementation of a mutual-capacitance touch panel.
Figure 2:
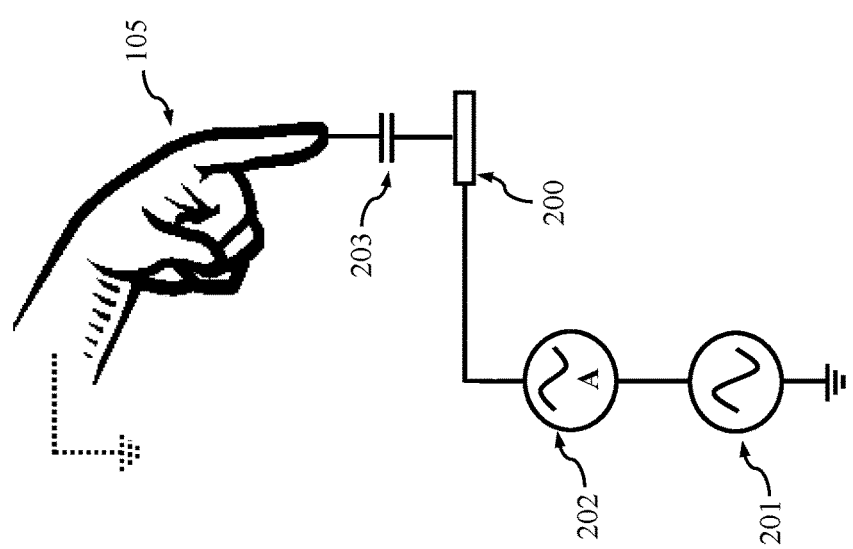
FIG. 2 shows a typical implementation of a self-capacitance touch panel.
Figure 3:
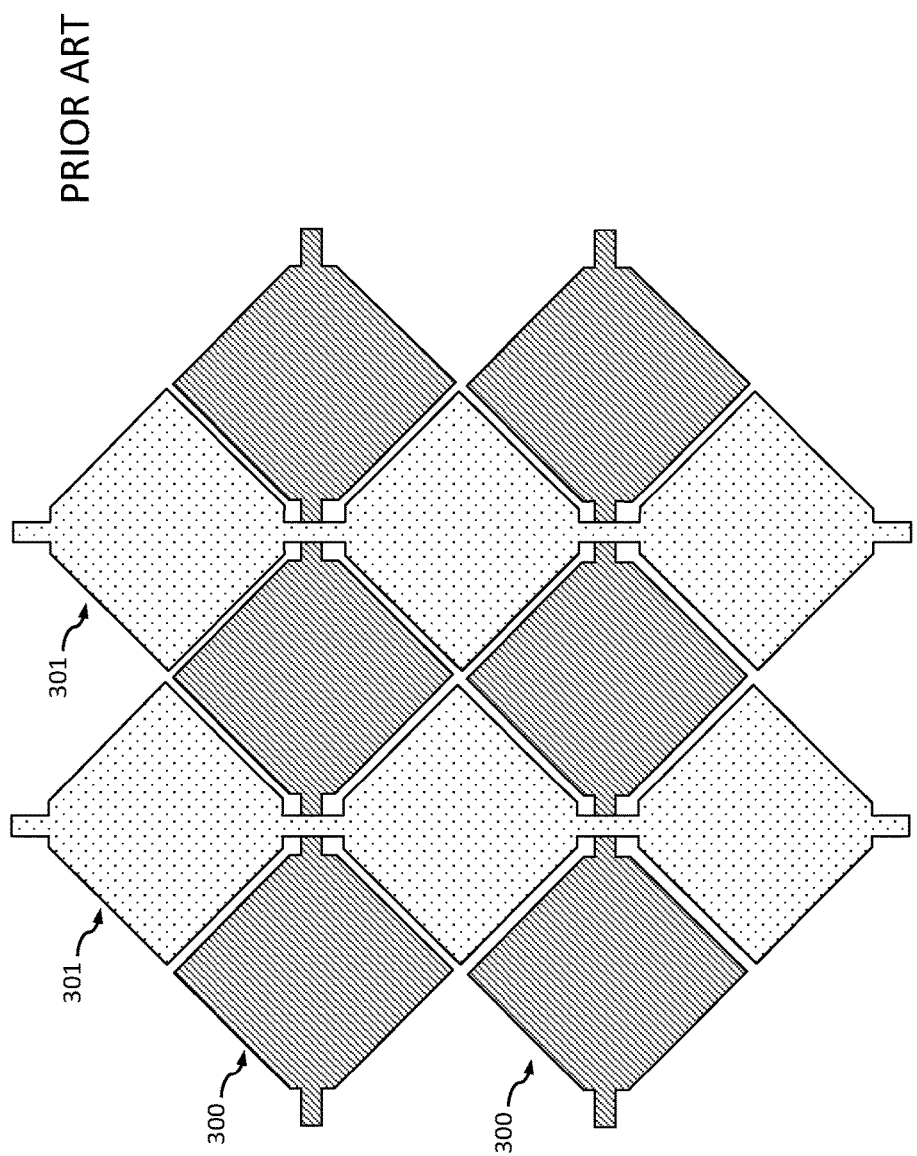
FIG. 3 shows a typical pattern of vertical and horizontal electrodes that may be used for mutual- or self-capacitance sensing.
Figure 4:
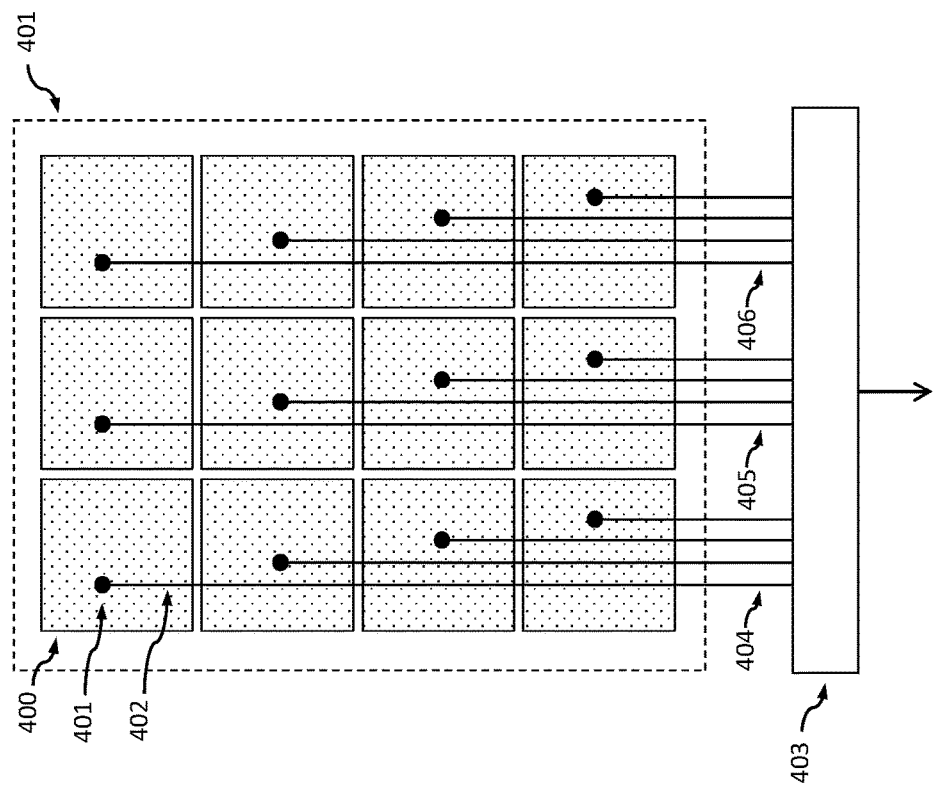
FIG. 4 shows a two-dimensional array of electrodes on a first layer, with connections on a second layer to a controller.
Figure 5:
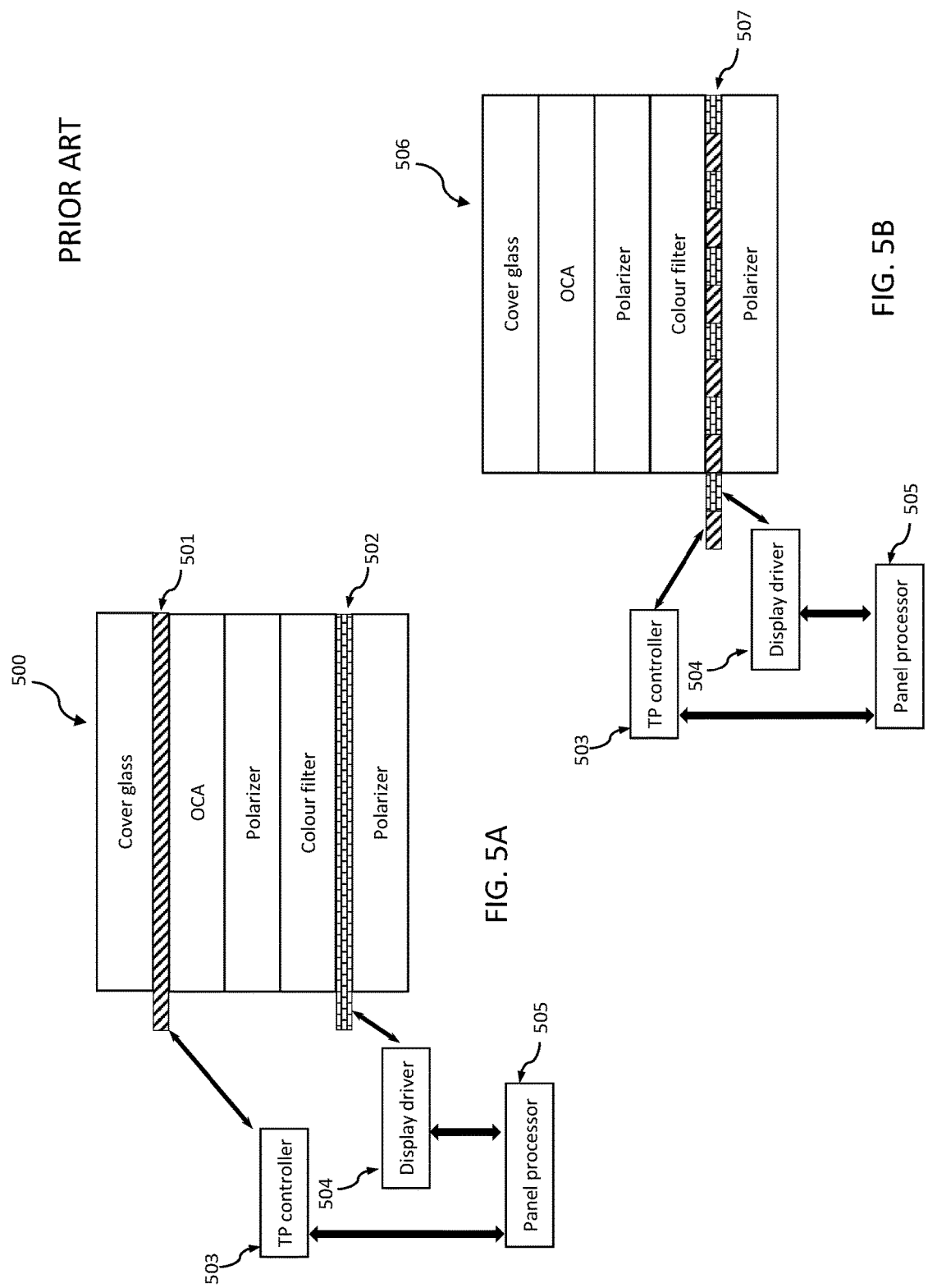
FIG. 5A shows a schematic sectional view of a touch screen.
FIG. 5B shows a schematic sectional view of a touch screen having an integrated touch and display layer.
Figure 6:
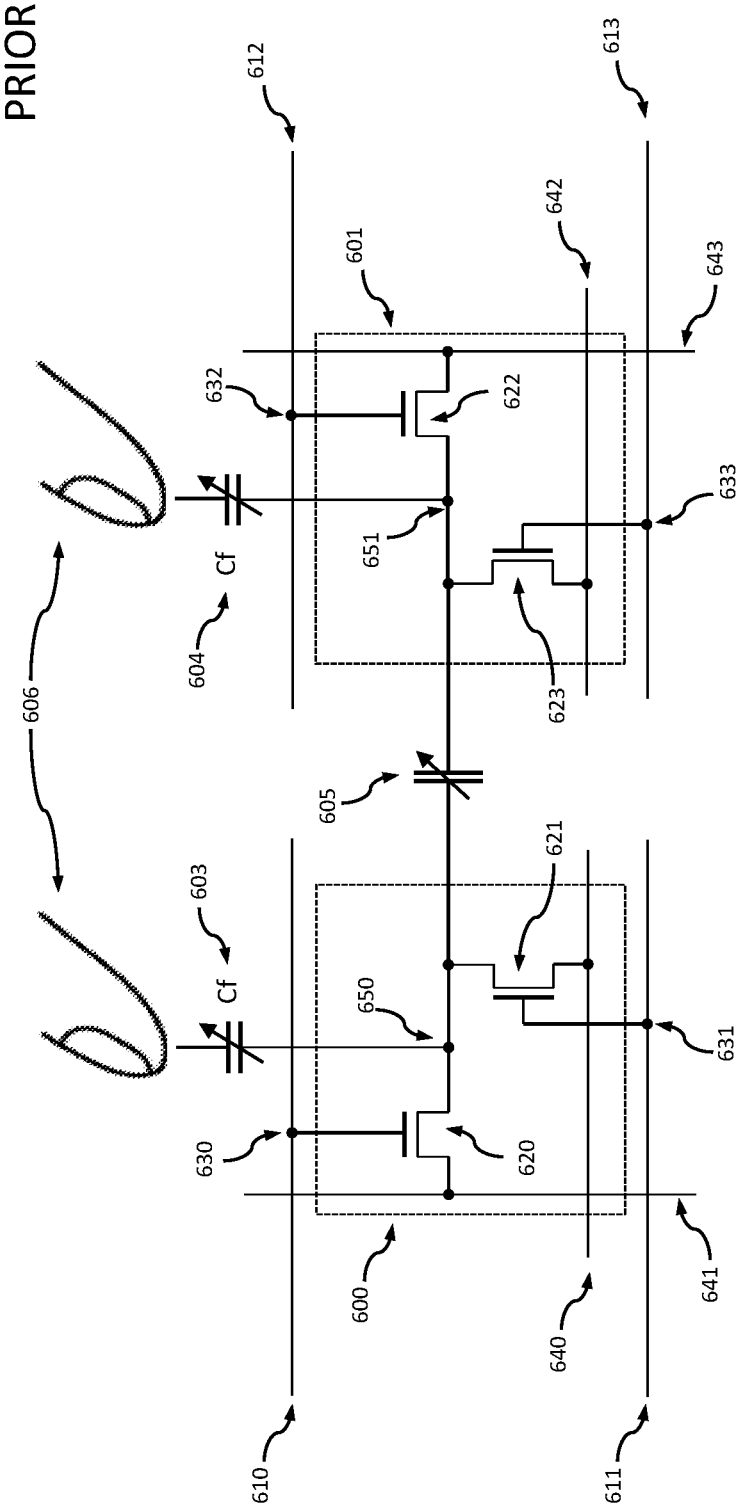
FIG. 6 shows an equivalent circuit diagram of two touch unit cells of an example embodiment of an active matrix touch sensor panel.
Figure 7:
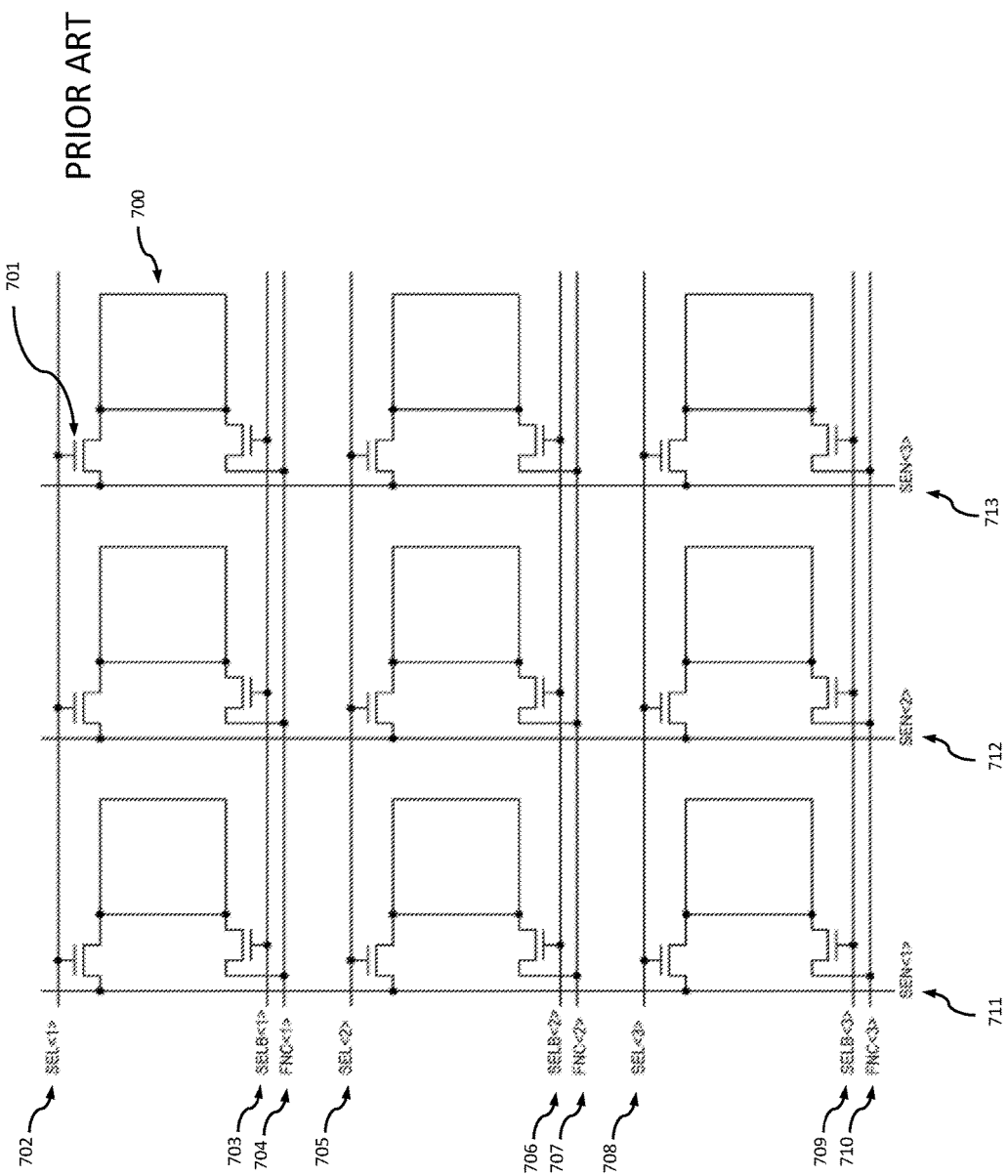
FIG. 7 shows an example embodiment of an active matrix touch sensor panel.

The touch sensor panel 801 is connected to a touch panel controller and control signal generator 804. The touch panel controller 804a and control signal generator 804b may be a part of a single sub-system 804 as indicated in FIG. 8, or may be separate sub-systems. The touch panel controller 804a and/or control signal generator 804b may be integrated with a display driver and/or other sub-systems. The control signal generator 804b configures the touch panel by applying voltages to the control lines 610, 611, (612, 613) described as to FIG. 6. The touch panel controller 804a detects touches on the touch sensor panel and determines the properties of the touches. This information is provided to a system control unit 805 that may include, for example, a processor, memory, and a display driver. The system control unit 805 outputs visual information to the display with integrated touch panel 801. The display may be, for example, an LCD or an OLED display or another type of display. The system control unit 805 may perform an action and may modify the visual information in response to touches detected by the touch panel controller 804a.

Figure 9:
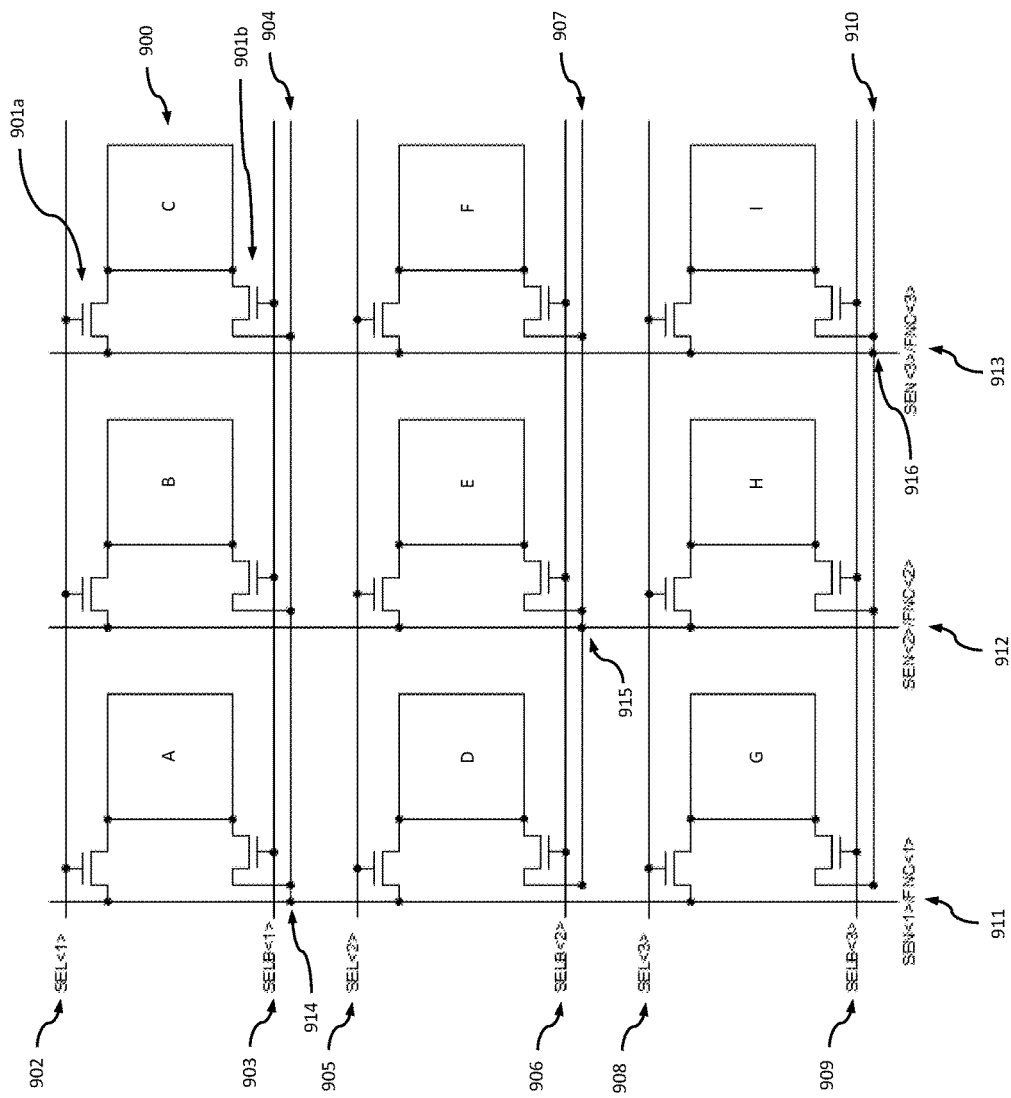
FIG. 9 shows an embodiment of an active matrix touch sensor panel in which each horizontal touch data line is connected to a different vertical touch data line.

FIG. 9 shows an embodiment of an in-cell active matrix touch sensor panel. In this embodiment there are nine touch sensitive electrodes 900. Other embodiments may have a different number of electrodes. Each electrode 900 is connected to two TFTs 901a and 901b. Each electrode and pair of TFTs may comprise several unit cells (such as those shown in FIG. 6) connected in parallel. In some embodiments, the basic unit cell structure of the active matrix touch panel may include more than two TFTs. For example, a third TFT may be used to amplify the sense signal as described in GB2542854A.

The "SEL1" gate control line 902 controls the state of the TFTs connecting electrodes in the first row to the vertical touch data lines 911-913. The "SEL2" gate control line 905 controls the state of the TFTs connecting electrodes in the second row to the vertical touch data lines 911-913. The "SEL3" gate control line 908 controls the state of the TFTs connecting electrodes in the third row to the vertical touch data lines 911-913. The "SELB1" gate control line 903 controls the state of the TFTs connecting electrodes in the first row to the first horizontal touch data line 904. The "SELB2" gate control line 906 controls the state of the TFTs connecting electrodes in the second row to the second horizontal touch data line 907. The "SELB3" gate control line 909 controls the state of the TFTs connecting electrodes in the third row to the third horizontal touch data line 910.

The structure of FIG. 9 may be implemented as disclosed in GB2542854A. The electrodes 900 may be fabricated in a first layer, the horizontal connecting lines 902, 903, 905, 906, 908 and 909 may be fabricated in a second layer, and the vertical connecting lines 911, 912 and 913 may be fabricated in a third layer.

The first horizontal touch data line 904 is connected to the first vertical touch data line 911 at point 914. The second horizontal touch data line 907 is connected to the second vertical touch data line 912 at point 915. The third horizontal touch data line 910 is connected to the first vertical touch data line 913 at point 916. The connecting points 914, 915 and 916 may be implemented as vias, making electrical connections between certain horizontal connecting lines in a first layer and certain vertical connecting lines in a second layer.

Control signals may be applied to the control lines 902, 903, 905, 906, 908 and 909 to configure the connections between the electrodes 900 and the touch data lines 904, 907, 910, 911, 912 and 913. In this embodiment, the touch data lines 911, 912 and 913 may be connected to a touch panel controller. The function of the touch data lines may be time-multiplexed between a drive period, when the touch panel controller applies one or more drive voltages, and a sense period, when the touch panel controller makes one or more measurements, for example measurements of charge.

Figure 10:
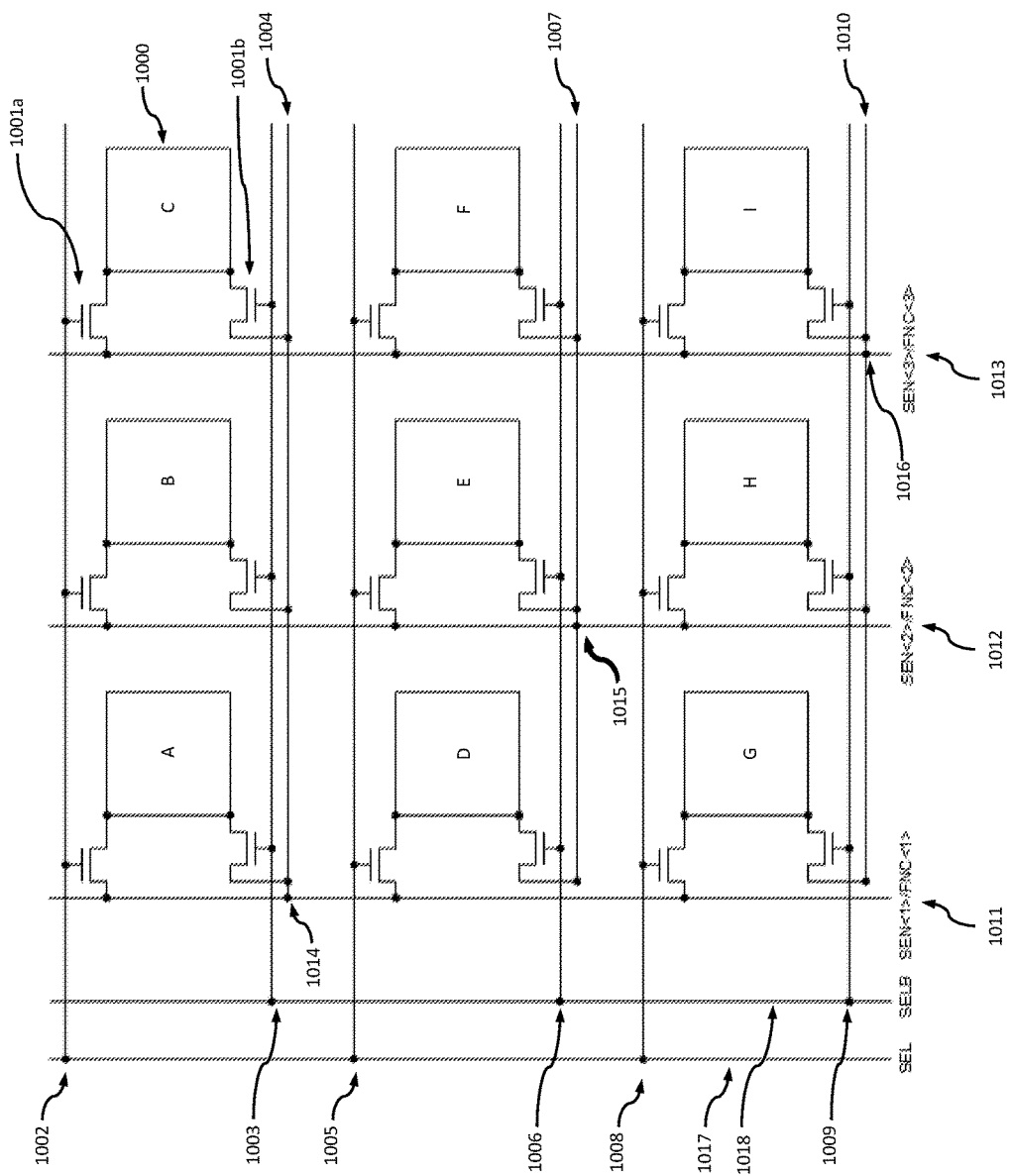
FIG. 10 shows an embodiment of an active matrix touch sensor panel in which each horizontal touch data line is connected to a different vertical touch data line, and the gate control lines are each connected to one of two common gate control lines.

FIG. 10 shows an embodiment of an in-cell active matrix touch sensor panel. In this embodiment there are nine touch sensitive electrodes 1000. Other embodiments may have a different number of electrodes. Each electrode 1000 is connected to two TFTs 1001a and 1001b. Each electrode and pair of TFTs may comprise several unit cells (such as those shown in FIG. 6) connected in parallel. In some embodiments, the basic unit cell structure of the active matrix touch panel may include more than two TFTs. For example, a third TFT may be used to amplify the sense signal as described in GB2542854A.

The "SEL1" gate control line 1002 controls the state of the TFTs connecting electrodes in the first row to the vertical touch data lines 1011-1013. The "SEL2" gate control line 1005 controls the state of the TFTs connecting electrodes in the second row to the vertical touch data lines 1011-1013. The "SEL3" gate control line 1008 controls the state of the TFTs connecting electrodes in the third row to the vertical touch data lines 1011-1013. The "SELB1" gate control line 1003 controls the state of the TFTs connecting electrodes in the first row to the first horizontal touch data line 1004. The "SELB2" gate control line 1006 controls the state of the TFTs connecting electrodes in the second row to the second horizontal touch data line 1007. The "SELB3" gate control line 1009 controls the state of the TFTs connecting electrodes in the third row to the third horizontal touch data line 1010.

The structure of FIG. 10 may be implemented as disclosed in GB2542854A. The electrodes 1000 may be fabricated in a first layer, the horizontal connecting lines 1002, 1003, 1005, 1006, 1008 and 1009 may be fabricated in a second layer, and the vertical connecting lines 1011, 1012 and 1013 may be fabricated in a third layer.

The first horizontal touch data line 1004 is connected to the first vertical touch data line 1011 at point 1014. The second horizontal touch data line 1007 is connected to the second vertical touch data line 1012 at point 1015. The third horizontal touch data line 1010 is connected to the first vertical touch data line 1013 at point 1016. The connecting points 1014, 1015 and 1016 may be implemented as vias, making electrical connections between certain horizontal connecting lines in a first layer and certain vertical connecting lines in a second layer.

The "SEL1", "SEL2" and "SEL3" gate control lines 1002, 1005 and 1008 are connected together by the "SEL" common gate control line 1017. The "SELB1", "SELB2" and "SELB3" gate control lines 1003, 1006 and 1009 are connected together by the "SELB" common gate control line 1018. Therefore in this embodiment, only two gate control lines are connected to a control signal generator. The common gate control lines 1017 and 1018 may be routed in the bezel area of the touch panel. In this embodiment, the bezel area may be very narrow, because only two touch panel connecting lines are routed in the bezel. Alternatively, in another embodiment, they may be routed in the active area.

In this embodiment, the horizontal gate control lines are connected in two groups by common gate control lines 1017 and 1018. It will be clear to one skilled in the art that the horizontal gate control lines may be grouped in different ways. For example, more than two common gate control lines may be used in order to enable different configurations to be implemented.

Control signals may be applied to the common gate control lines 1017 and 1018 to configure the connections between the electrodes 1000 and the touch data lines 1004, 1007, 1010, 1011, 1012 and 1013. In this embodiment, the touch data lines 1011, 1012 and 1013 may be connected to a touch panel controller. The function of the touch data lines may be time-multiplexed between a drive period, when the touch panel controller applies one or more drive voltages, and a sense period, when the touch panel controller makes one or more measurements, for example measurements of charge.

Figure 11:
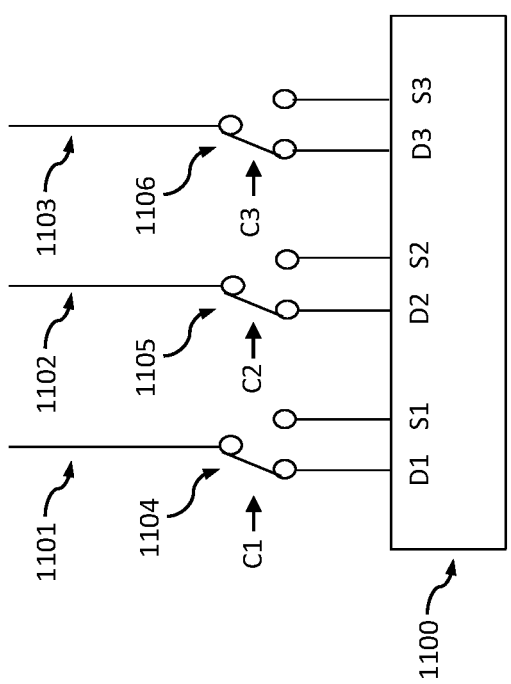
FIG. 11 shows an embodiment of a set of multiplexing switches that may be connected to vertical touch data lines.

FIG. 11 shows an embodiment of a multiplexer that may be used to connect a touch panel controller 1100 to the vertical touch data lines 911, 912 and 913 of FIG. 9, or 1011, 1012 and 1013 of FIG. 10. Connecting line 1101 may be connected to touch data line 911 (or 1011), connecting line 1102 may be connected to touch data line 912 (or 1012) and connecting line 1103 may be connected to touch data line 913 (or 1013). A first switch 1104, controlled by a first control signal C1, connects the first connecting line 1101 to a first drive line D1 or to a first sense line S1 of the touch panel controller 1100. A second switch 1105, controlled by a second control signal C2, connects the second connecting line 1102 to a second drive line D2 or to a second sense line S2 of the touch panel controller 1100. A third switch 1106, controlled by a third control signal C3, connects the third connecting line 1103 to a third drive line D3 or to a third sense line S3 of the touch panel controller 1100. The switches 1104, 1105 and 1106 may be implemented using TFTs or CMOS transistors or other components. They may be located on the touch sensor panel, either within the active area or the bezel area, or they may be located in a touch panel controller or timing signal generator, or they may be located within another sub-system such as a multiplexer.

Figure 12:
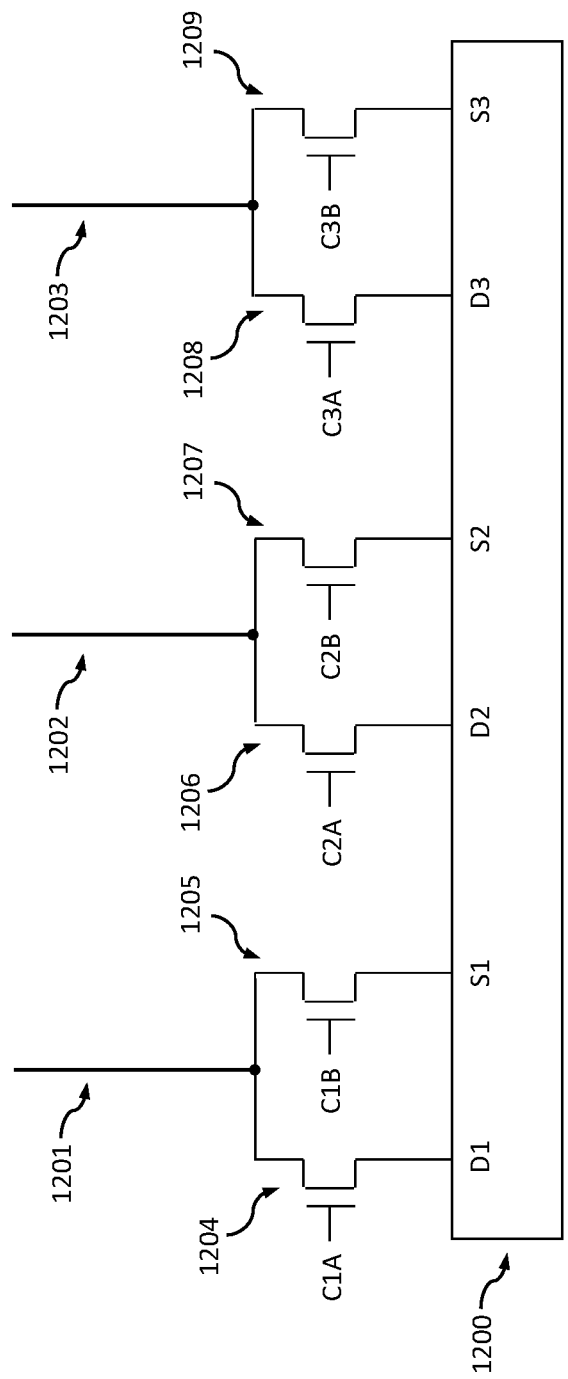
FIG. 12 shows an embodiment of a set of multiplexing switches, implemented using TFTs, that may be connected to vertical touch data lines.

FIG. 12 shows an embodiment of the multiplexer of FIG. 11, in which the switches are implemented as pairs of TFTs. Many other embodiments are possible that use different implementations. Connecting line 1201 may be connected to touch data line 911 (or 1011), connecting line 1202 may be connected to touch data line 912 (or 1012) and connecting line 1203 may be connected to touch data line 913 (or 1013). A first TFT 1204, controlled by a control signal C1A, can connect the first connecting line 1201 to a first drive line D1 of the touch panel controller 1200. A second TFT 1205, controlled by a control signal C1B, can connect the first connecting line 1201 to a first sense line S1 of the touch panel controller 1200. A third TFT 1206, controlled by a control signal C2A, can connect the second connecting line 1202 to a second drive line D2 of the touch panel controller 1200. A fourth TFT 1207, controlled by a control signal C2B, can connect the second connecting line 1202 to a second sense line S2 of the touch panel controller 1200. A fifth TFT 1208, controlled by a control signal C3A, can connect the third connecting line 1203 to a third drive line D3 of the touch panel controller 1200. A sixth TFT 1209, controlled by a control signal C3B, can connect the third connecting line 1203 to a third sense line S3 of the touch panel controller 1200.

Figure 13:
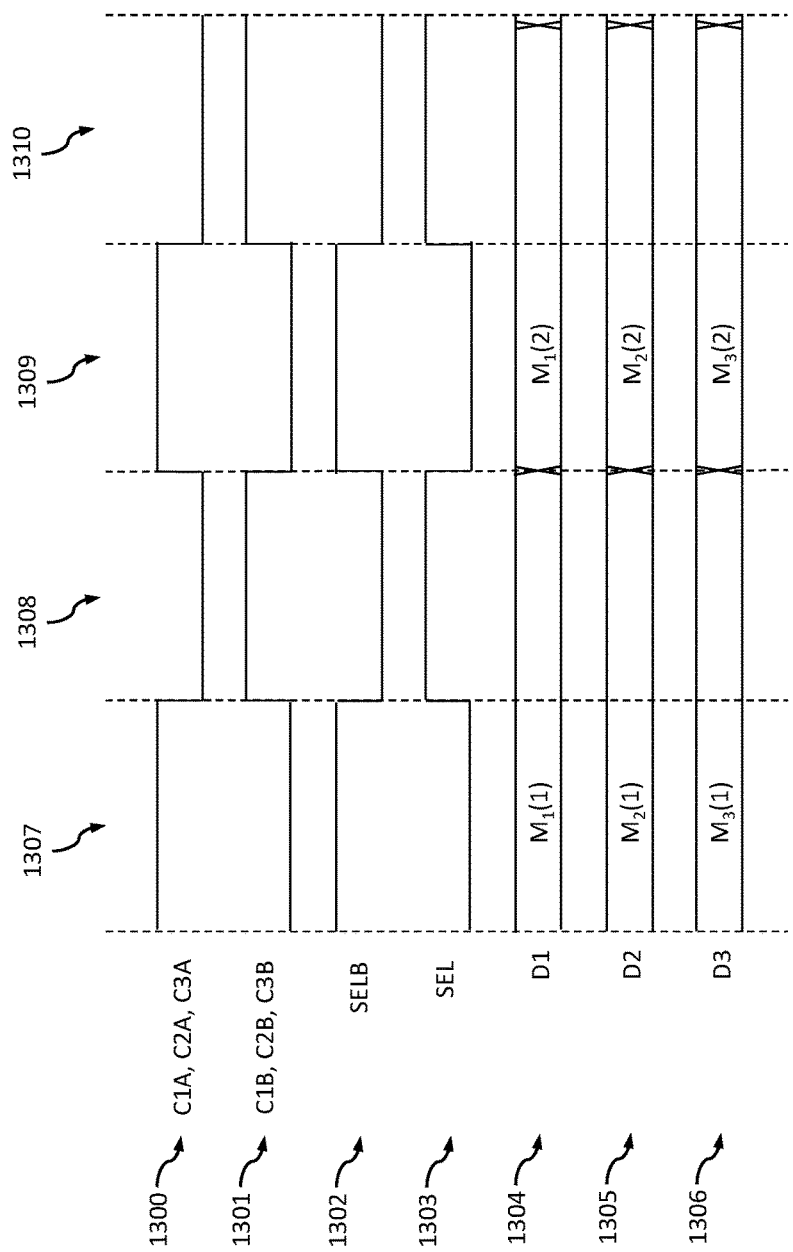
FIG. 13 shows an example of control signals and drive signals that may be applied to the control lines and touch data lines of an active matrix touch sensor panel.

FIG. 13 shows a timing diagram, including control signals C1A, C2A and C3A (1300) and C1B, C2B and C3B (1301), which may be applied to the multiplexer of FIG. 12. FIG. 13 also shows control signal SELB (1302), which may be applied to common gate control line 1018 of FIG. 10. FIG. 13 also shows control signal SEL (1303), which may be applied to common gate control line 1017 of FIG. 10. Alternatively, control signal SELB (1302) may be applied to gate control lines 903, 906 and 909 of FIG. 9 and control signal SEL (1303) may be applied to gate control lines 902, 905 and 908 of FIG. 9. The control signals 1300, 1301, 1302 and 1303 may be high or low at a given time. A high control signal corresponds to a high voltage, for example 3V or 5V or 10V or 20V or 30V or another high voltage. A low control signal corresponds to a low voltage, for example 0V or −5V or another low voltage.

During a first time period 1307 and a third time period 1309, control signals C1A, C2A and C3A (1300) are high, turning on the TFTs 1204, 1206 and 1208; control signals C1B, C2B and C3B (1301) are low, turning off the TFTs 1205, 1207 and 1209; control signal SELB (1302) is high, turning on TFTs 1001b; and control signal SEL (1303) is low, turning off TFTs 1001a. Electrodes A, B and C are therefore connected via TFTs 1001b to touch data lines 1004 and 1011, and therefore via TFT 1204 to drive line D1. Electrodes D, E and F are connected via TFTs 1001b to touch data lines 1007 and 1012, and therefore via TFT 1206 to drive line D2. Electrodes G, H and I are connected via TFTs 1001b to touch data lines 1010 and 1013, and therefore via TFT 1208 to drive line D3.

During a second time period 1308 and a fourth time period 1310, control signals C1A, C2A and C3A (1300) are low, turning off the TFTs 1204, 1206 and 1208; control signals C1B, C2B and C3B (1301) are high, turning on the TFTs 1205, 1207 and 1209; control signal SELB (1302) is low, turning off TFTs 1001b; and control signal SEL (1303) is high, turning on TFTs 1001a. Electrodes A, D and G are therefore connected via TFTs 1001a to touch data line 1011, and therefore via TFT 1205 to sense line S1. Electrodes B, E and H are connected via TFTs 1001*a* to touch data line 1012, and therefore via TFT 1207 to sense line S2. Electrodes C, F and I are connected via TFTs 1001*a* to touch data line 1013, and therefore via TFT 1209 to sense line S3.

During the first time period 1307 and the third time period 1309, the touch panel controller may generate drive signals on drive lines D1, D2 and D3. The electrodes connected (via TFTs) to each drive line are therefore charged to the corresponding voltage. During the second time period 1308 and the fourth time period 1310, the touch panel controller may measure the inputs to sense lines S1, S2 and S3. This may include measuring the charge stored on the electrodes connected (via TFTs) to each sense line. The touch panel controller may perform a sequence of several such drive and sense operations. The control signals generated in FIG. 13 may be repeated to enable a large number of similar measurements to be made. If the drive signals D1, D2 and D3 are chosen to form orthogonal codes, the sequence of measurements can be decoded by the touch panel controller to determine the charge stored on each of the nine electrodes 1000 using the method disclosed in WO2017056900A1. These charge measurements correspond to the self-capacitance of each electrode, and these capacitance measurements allow the location of one or more touches by conductive objects, such as fingers or passives styluses, to be determined.

FIG. 13 shows drive signals D1 (1304), D2 (1305) and D3 (1306) which are described by the codes $M_1(k)$, $M_2(k)$ and $M_3(k)$ respectively, where k may be a positive integer between 1 and n, where n is the total length of the drive code. These codes may be chosen such that they are fully or partially orthogonal.

The drive signals D1, D2 and D3 may take one of two voltages, and switch between those voltages as determined by the drive code. For example they may switch between −1V and +1V, or alternatively between 0V and 3V. Many other voltages may be used.

Figure 14:
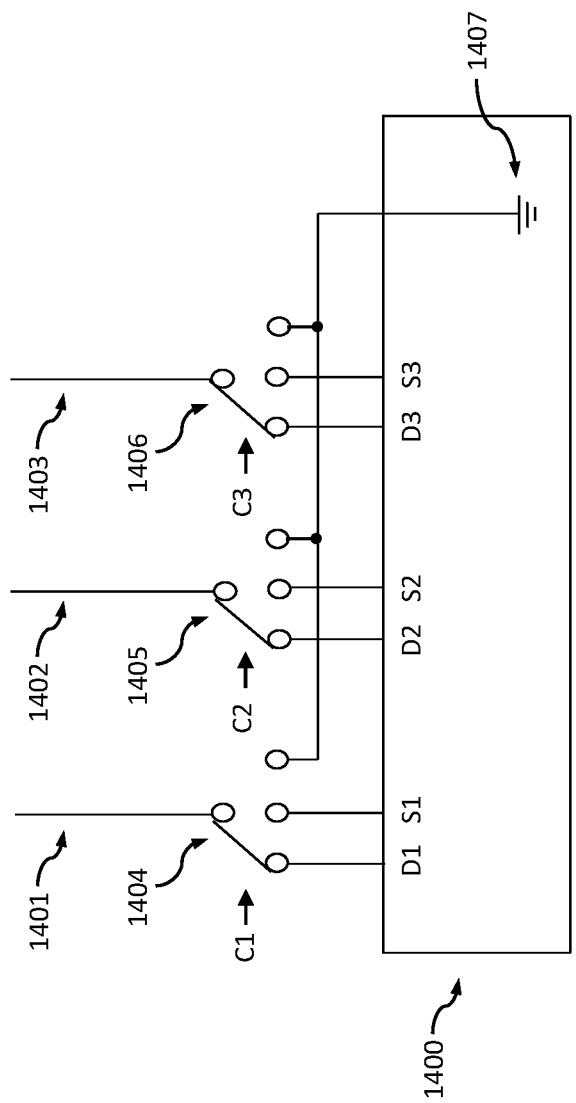
FIG. 14 shows an embodiment of a set of multiplexing switches that may be connected to vertical touch data lines.

FIG. 14 shows an embodiment of a multiplexer that may be used to connect a touch panel controller 1400 to the vertical touch data lines 911, 912 and 913 of FIG. 9, or 1011, 1012 and 1013 of FIG. 10. Connecting line 1401 may be connected to touch data line 911 (or 1011), connecting line 1402 may be connected to touch data line 912 (or 1012) and connecting line 1403 may be connected to touch data line 913 (or 1013). A first switch 1404, controlled by a first control signal C1, connects the first connecting line 1401 to a first drive line D1 or to a first sense line S1 of the touch panel controller 1400, or to ground 1407 or another DC voltage. A second switch 1405, controlled by a second control signal C2, connects the second connecting line 1402 to a second drive line D2 or to a second sense line S2 of the touch panel controller 1400, or to ground 1407 or another DC voltage. A third switch 1406, controlled by a third control signal C3, connects the third connecting line 1403 to a third drive line D3 or to a third sense line S3 of the touch panel controller 1400, or to ground 1407 or another DC voltage. The switches 1404, 1405 and 1406 may be implemented using TFTs or CMOS transistors or other components. They may be located on the touch sensor panel, either within the active area or the bezel area, or they may be located in a touch panel controller or timing signal generator, or they may be located within another sub-system such as a multiplexer.

Figure 15:
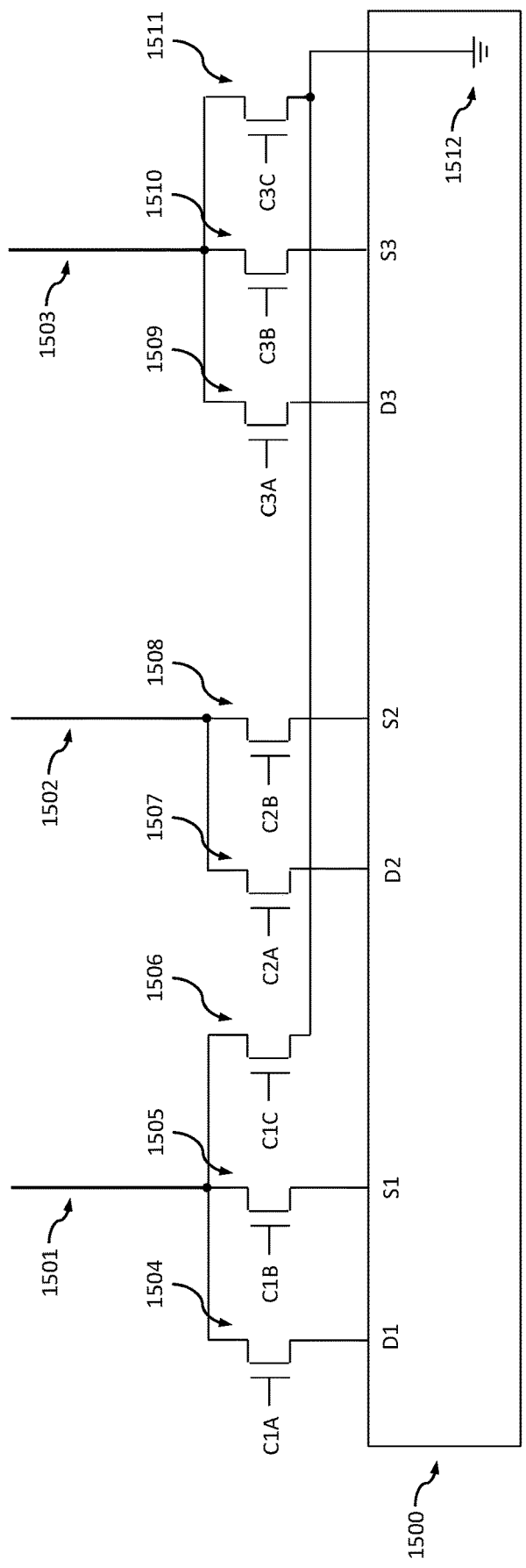
FIG. 15 shows an embodiment of a set of multiplexing switches, implemented using TFTs, that may be connected to vertical touch data lines.

FIG. 15 shows an embodiment of the multiplexer of FIG. 14, in which the switches are implemented using TFTs. Many other embodiments are possible that use different implementations. Connecting line 1501 may be connected to touch data line 911 (or 1011), connecting line 1502 may be connected to touch data line 912 (or 1012) and connecting line 1503 may be connected to touch data line 913 (or 1013). A first TFT 1504, controlled by a control signal C1A, can connect the first connecting line 1501 to a first drive line D1 of the touch panel controller 1500. A second TFT 1505, controlled by a control signal C1B, can connect the first connecting line 1501 to a first sense line S1 of the touch panel controller 1500. A third TFT 1506, controlled by a control signal C1C, can connect the first connecting line 1501 to ground 1512 or another DC voltage. A fourth TFT 1507, controlled by a control signal C2A, can connect the second connecting line 1502 to a second drive line D2 of the touch panel controller 1500. A fifth TFT 1508, controlled by a control signal C2B, can connect the second connecting line 1502 to a second sense line S2 of the touch panel controller 1500. A sixth TFT 1509, controlled by a control signal C3A, can connect the third connecting line 1503 to a third drive line D3 of the touch panel controller 1500. A seventh TFT 1510, controlled by a control signal C3B, can connect the third connecting line 1503 to a third sense line S3 of the touch panel controller 1500. An eighth TFT 1511, controlled by a control signal C3C, can connect the third connecting line 1503 to ground 1512 or another DC voltage.

Figure 16:
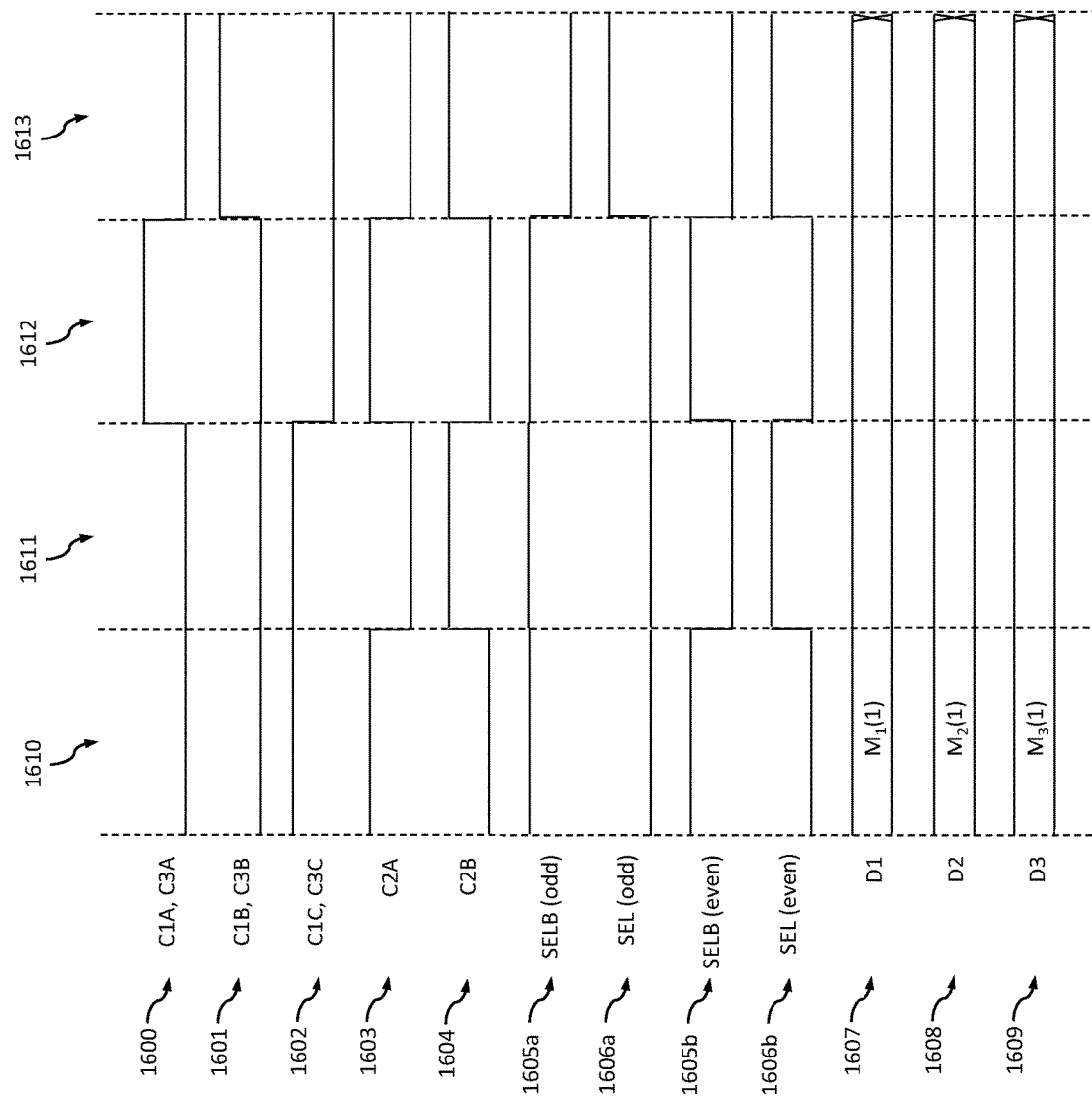
FIG. 16 shows an example of control signals and drive signals that may be applied to the control lines and touch data lines of an active matrix touch sensor panel.

FIG. 16 shows a timing diagram, including control signals C1A and C3A (1600), C1B and C3B (1601), C1C and C3C (1602), C2A (1603) and C2B (1604), which may be applied to the multiplexer of FIG. 15. FIG. 16 also shows control signal SELB (1605), which may be applied to common gate control line 1018 of FIG. 10. FIG. 16 also shows control signal SEL (1606), which may be applied to common gate control line 1017 of FIG. 10. Alternatively, control signal SELB (1605) may be applied to gate control lines 903, 906 and 909 of FIG. 9 and control signal SEL (1606) may be applied to gate control lines 902, 905 and 908 of FIG. 9. The control signals 1600, 1601, 1602, 1603, 1604, 1605, and 1606 may be high or low at a given time. A high control signal corresponds to a high voltage, for example 3V or 5V or 10V or 20V or 30V or another high voltage. A low control signal corresponds to a low voltage, for example 0V or −5V or another low voltage.

During a first time period 1610, control signals C1A and C3A (1600) are low, turning off the TFTs 1504 and 1509; control signals C1B and C3B (1601) are low, turning off the TFTs 1505 and 1510; control signals C1C and C3C (1602) are high, turning on the TFTs 1506 and 1511; control signal C2A (1603) is high, turning on the TFT 1507; control signal C2B (1604) is low, turning off the TFT 1508; control signal SELB (1605) is high, turning on TFTs 1001*b*; and control signal SEL (1606) is low, turning off TFTs 1001*a*. Electrodes A, B and C are therefore connected via TFTs 1001*b* to touch data lines 1004 and 1011, and therefore via TFT 1506 to ground 1512. Electrodes D, E and F are connected via TFTs 1001*b* to touch data lines 1007 and 1012, and therefore via TFT 1507 to drive line D2. Electrodes G, H and I are connected via TFTs 1001*b* to touch data lines 1010 and 1013, and therefore via TFT 1511 to ground 1512.

During a second time period 1611, control signals C1A and C3A (1600) are low, turning off the TFTs 1504 and 1509; control signals C1B and C3B (1601) are low, turning off the TFTs 1505 and 1510; control signals C1C and C3C (1602) are high, turning on the TFTs 1506 and 1511; control signal C2A (1603) is low, turning off the TFT 1507; control signal C2B (1604) is high, turning on the TFT 1508; control signal SELB (1605) is low, turning off TFTs 1001*b*; and control signal SEL (1606) is high, turning on TFTs 1001*a*.

Electrodes A, D and G are therefore connected via TFTs 1001*a* to touch data line 1011, and therefore via TFT 1506 to ground 1512. Electrodes B, E and H are connected via TFTs 1001*a* to touch data line 1012, and therefore via TFT 1508 to sense line S2. Electrodes C, F and I are connected via TFTs 1001*a* to touch data line 1013, and therefore via TFT 1511 to ground 1512.

During a third time period 1612, control signals C1A and C3A (1600) are high, turning on the TFTs 1504 and 1509; control signals C1B and C3B (1601) are low, turning off the TFTs 1505 and 1510; control signals C1C and C3C (1602) are low, turning off the TFTs 1506 and 1511; control signal C2A (1603) is high, turning on the TFT 1507; control signal C2B (1604) is low, turning off the TFT 1508; control signal SELB (1605) is high, turning on TFTs 1001*b*; and control signal SEL (1606) is low, turning off TFTs 1001*a*. Electrodes A, B and C are therefore connected via TFTs 1001*b* to touch data lines 1004 and 1011, and therefore via TFT 1504 to drive line D1. Electrodes D, E and F are connected via TFTs 1001*b* to touch data lines 1007 and 1012, and therefore via TFT 1507 to drive line D2. Electrodes G, H and I are connected via TFTs 1001*b* to touch data lines 1010 and 1013, and therefore via TFT 1509 to drive line D3.

During a fourth time period 1613, control signals C1A and C3A (1600) are low, turning off the TFTs 1504 and 1509; control signals C1B and C3B (1601) are high, turning on the TFTs 1505 and 1510; control signals C1C and C3C (1602) are low, turning off the TFTs 1506 and 1511; control signal C2A (1603) is low, turning off the TFT 1507; control signal C2B (1604) is high, turning on the TFT 1508; control signal SELB (1605) is low, turning off TFTs 1001*b*; and control signal SEL (1606) is high, turning on TFTs 1001*a*. Electrodes A, D and G are therefore connected via TFTs 1001*a* to touch data line 1011, and therefore via TFT 1505 to sense line S1. Electrodes B, E and H are connected via TFTs 1001*a* to touch data line 1012, and therefore via TFT 1508 to sense line S2. Electrodes C, F and I are connected via TFTs 1001*a* to touch data line 1013, and therefore via TFT 1510 to sense line S3.

During the first time period 1610 and the third time period 1612, the touch panel controller may generate drive signals on drive lines D1, D2 and D3. The electrodes connected (via TFTs) to each drive line are therefore charged to the corresponding voltage. During the second time period 1611 and the fourth time period 1613, the touch panel controller may measure the inputs to sense lines S1, S2 and S3. This may include measuring the charge stored on the electrodes connected (via TFTs) to each sense line. During the first time period 1610 and the second time period 1611, the driven electrodes (D, E and F) are adjacent to grounded electrodes (A, B, C, G, H and I). Therefore the charge stored on each driven electrode is determined by both the "mutual-capacitance" of the electrode to the neighbouring grounded electrodes, and the "self-capacitance" of the electrode to a conductive input object such as a finger or stylus that may be nearby. During the third time period 1612 and the fourth time period 1613, the driven electrodes (A, B, C, D, E, F, G, H and I) are not adjacent to grounded electrodes. Therefore the charge stored on each driven electrode is determined primarily by the "self-capacitance" of the electrode to a conductive input object such as a finger or stylus that may be nearby. In this way, it is possible to measure both the self-capacitance and the sum of the mutual- and self-capacitance of each electrode. The difference between these values can be used to calculate the mutual capacitance, and therefore to determine whether an object is conductive or non-conductive, and to enable other features, as described in Applicant's commonly owned invention entitled Capacitive Touch Sensing With Conductivity Type Determination, which has a filing date commensurate with the current application and is incorporated here by reference in its entirety.

The touch panel controller may perform a sequence of several drive and sense operations to measure the self-capacitance of each electrode, and a sequence of several drive and sense operations to measure the sum of the mutual- and self-capacitance of each electrode. The control signals generated in FIG. 13 may be repeated to enable a large number of similar measurements to be made. If the drive signals D1, D2 and D3 used for each type of measurement are chosen to form orthogonal codes, the sequence of measurements can be decoded by the touch panel controller to determine the charge stored on each of the nine electrodes 1000 using the method disclosed in WO2017056900A1. These charge measurements correspond to the self-capacitance of each electrode, or to the sum of self- and mutual-capacitance, and these capacitance measurements allow the location of one or more touches by conductive objects, such as fingers or passives styluses, and/or non-conductive objects, to be determined.

FIG. 16 shows drive signals D1 (1607), D2 (1608) and D3 (1609) which are described by the codes $M_1(k)$, $M_2(k)$ and $M_3(k)$ respectively, where k may be a positive integer between 1 and n, where n is the total length of the drive code. These codes may be chosen such that they are fully or partially orthogonal. The same drive code values may be used for the measurements made in time periods 1610 and 1611, and for the measurements made in time periods 1612 and 1613, as shown in FIG. 16. Alternatively, different drive codes may be used for the different types of measurements.

The drive signals D1, D2 and D3 may take one of two voltages, and switch between those voltages as determined by the drive code. For example they may switch between −1V and +1V, or alternatively between 0V and 3V. Many other voltages may be used.

There are many other possible embodiments of this invention that use different multiplexing and/or timing of the touch data signals and control signals.

The TFTs 1204, 1205, 1206, 1207, 1208 and 1209 of FIGS. 12 and 1504, 1505, 1506, 1507, 1508, 1509, 1510 and 1511 of FIG. 15 may be implemented in the lower bezel region of a display with an integrated touch panel. The TFTs 901 and 1001 may be implemented as distributed TFTs within the display active areas as described in GB2542854A. These TFTs may be implemented using standard fabrication processes that may also be used to fabricate TFTs that form part of the display circuitry.

Figure 17:
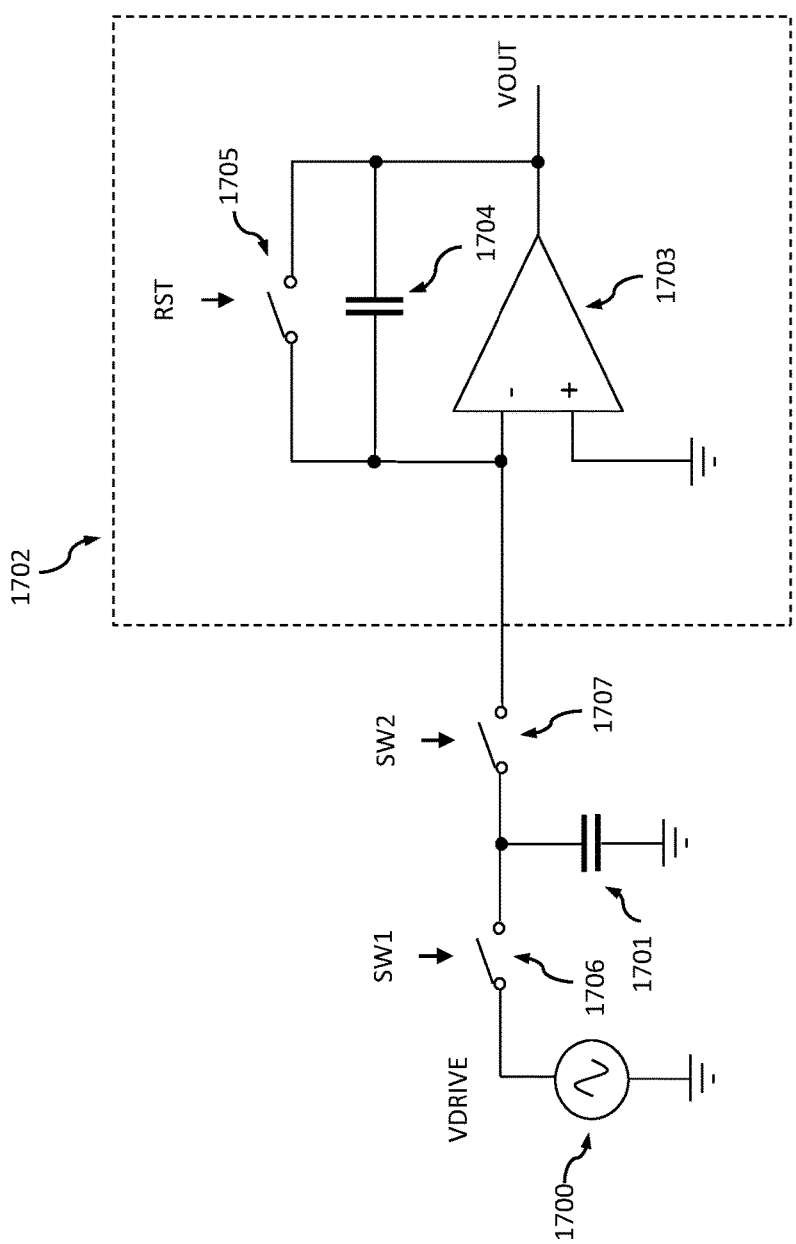
FIG. 17 shows an embodiment of a drive signal generator, charge amplifier, and switches, which may be used to measure the capacitance of electrodes in an active matrix touch sensor panel.

FIG. 17 shows a drive signal generator, a charge amplifier, and switches that may be used by the touch panel controller to measure the charge on one or more touch panel electrodes. The amplifier circuit described herein is provided as an example of a capacitance measurement circuit using a charge transfer technique as is well-known in the field. Alternatively, other known circuits and techniques for capacitance measurement may be used. A drive signal generator 1700 supplies drive voltage pulses to one or more active electrodes during a drive phase. This causes a charge to be stored on capacitor 1701, which is the capacitance between the active electrode(s) and ground. The charge amplifier circuit 1702 subsequently measures the charge stored on capacitor 1701 during a sense phase. Such a charge amplifier circuit 1702 will be well known to one skilled in the art, and typically comprises an operational amplifier 1703, an integration capacitor 1704 and a reset switch 1705.

The system additionally has a first input switch 1706 and a second input switch 1707 which allow the active electrode(s) to be connected to the drive signal generator 1700 or the charge amplifier 1702. These switches may be part of a multiplexer circuit, such as the embodiments show in FIG. 11, FIG. 12, FIG. 14 and FIG. 15. The output voltage VOUT is proportional to the capacitance of capacitor 1701, which is the capacitance of the active electrode(s) to ground.

Figure 18:
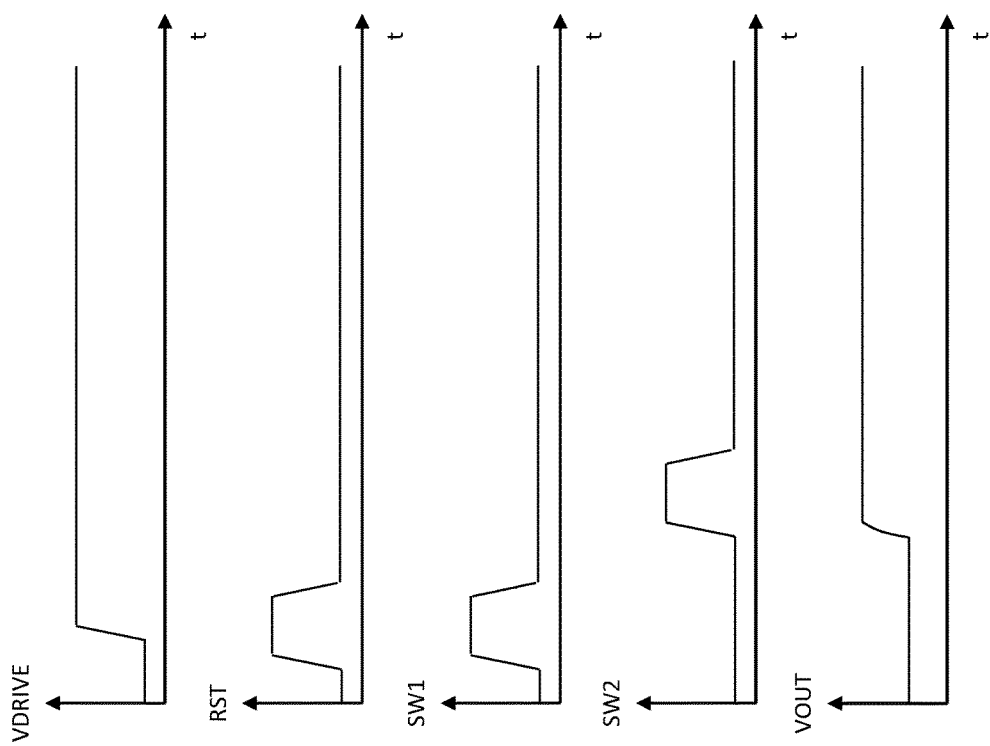
FIG. 18 shows an example of control signals and drive signals that may be used with the circuit of FIG. 17, and the resulting output voltage of the circuit.

The operation of the capacitance measurement circuit shown in FIG. 17 is now described with reference to the waveform diagram of FIG. 18. The reset switch 1705 is firstly closed under the control of a reset switch control signal RST so that the output voltage VOUT begins at a known voltage, such as the system ground potential. The first input switch 1706 is also closed under the control of a first input switch control signal SW1. The voltage pulse generator 1700 then raises the voltage of the active electrode(s) to a high voltage level, causing a charge to be stored on capacitor 1701. Next, the first input switch 1706 is opened and the second input switch 1707 is closed under the control of a second input switch control signal SW2. The charge on the capacitor 1701 then discharges into the charge amplifier 1702, causing the output voltage VOUT to rise. The final output voltages of the charge amplifier 1702 may be measured using an analogue to digital converter, in order to generate a digital representation corresponding to the measured capacitance.

Figure 19:
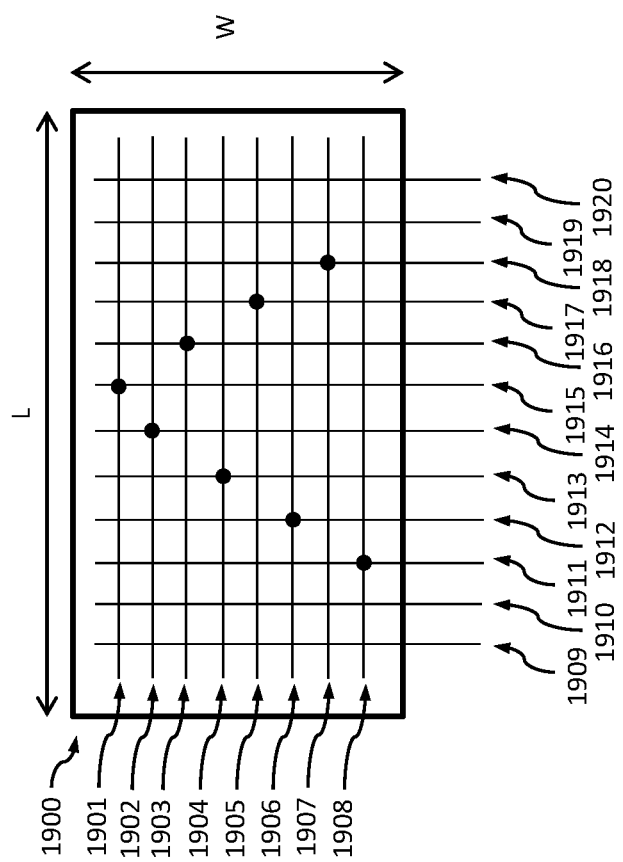
FIG. 19 shows an embodiment of an active matrix touch sensor panel, including the touch data lines and the connections between them.

FIG. 19 shows an embodiment of an active matrix touch sensor panel 1900 which has a length L which is greater than its width W. FIG. 19 shows a number of horizontal touch data lines 1901, 1902, 1903, 1904, 1905, 1906, 1907, 1908 and vertical touch data lines 1909, 1910, 1911, 1912, 1913, 1914, 1915, 1916, 1917, 1918, 1919 and 1920, and the vias that connect certain horizontal touch data lines to certain vertical touch data lines. Horizontal touch data line 1901 is connected to vertical touch data line 1915. Horizontal touch data line 1902 is connected to vertical touch data line 1914. Horizontal touch data line 1903 is connected to vertical touch data line 1916, and so on. Touch data lines are routed to a multiplexer and/or touch panel controller through the lower edge of the panel. TFTs may be formed in the lower bezel area to perform multiplexing functions. Relative to many other possible configurations, this pattern of connections reduces the maximum total length of the horizontal and vertical touch panel data lines, routed in the active area, between any electrode and the touch panel controller. This therefore reduces the maximum RC time constant of the touch panel electrodes.

An aspect of the invention, therefore, is capacitive sensing array including an array of electrodes; first conductive data lines arranged in a first direction and second conductive data lines arranged in a second direction different from the first direction; first switching elements configured to connect each electrode to a first conductive line in the first direction, and second switch elements configured to connect each electrode to a second conductive line in the second direction; and control lines connected to the first and second switching elements. Electrical connections are present between each first conductive data line in the first direction and a second conductive data line in the second direction such that each first conductive line in the first direction is connected to at least one second conductive line in the second direction. The capacitive sensing array may include one or more of the following features, either individually or in combination.

In an exemplary embodiment of the capacitive sensing array, sub-sets of the control lines connected to the switching elements are connected together by common control lines.

In an exemplary embodiment of the capacitive sensing array, there are two common control lines.

In an exemplary embodiment of the capacitive sensing array, multiplexing switches are provided that connect the second conductive data lines arranged in the second direction to drive and sense connections of a touch panel controller.

In an exemplary embodiment of the capacitive sensing array, the multiplexing switches further connect the second conductive data lines arranged in the second direction to another voltage.

In an exemplary embodiment of the capacitive sensing array, the another voltage comprises a ground voltage or another fixed DC voltage.

In an exemplary embodiment of the capacitive sensing array, the multiplexing switches comprise thin film transistors (TFTs).

In an exemplary embodiment of the capacitive sensing array, the TFTs are located in a lower bezel area of an active matrix touch sensor panel.

In an exemplary embodiment of the capacitive sensing array, the multiplexing switches comprise CMOS transistors.

In an exemplary embodiment of the capacitive sensing array, the CMOS transistors are located within a touch panel controller.

Another aspect of the invention is a touch panel display device that includes the capacitive sensing array that is implemented as an active matrix touch sensor panel integrated with a display; and wherein the electrode array is formed from a VCOM electrode of the display, and each of the first and second switching elements comprise one or more TFTs. The touch panel display device may include one or more of the following features, either individually or in combination.

In an exemplary embodiment of the touch panel display device, the one or more TFTs are distributed within an active area of the display.

In an exemplary embodiment of the touch panel display device, the device further includes a touch panel controller that is configured to apply drive signals to one or more of the second conductive data lines arranged in the second direction during a first time period, and to measure signals on the one or more second conductive data lines during a second time period.

In an exemplary embodiment of the touch panel display device, the controller is configured to measure signals comprising charge or current measurements.

In an exemplary embodiment of the touch panel display device, the device further includes a control signal generator that is configured to apply control signals to the control lines that cause the electrodes to be connected to the first conductive data line in the first direction during the first time period, and to be connected to the second conductive data line in the second direction during the second time period.

In an exemplary embodiment of the touch panel display device, the drive signals form a fully or partially orthogonal code.

In an exemplary embodiment of the touch panel display device, the touch panel controller is configured to measure a self-capacitance of each electrode in the array of electrodes.

In an exemplary embodiment of the touch panel display device, a portion of the electrodes of the array of electrodes are connected to ground or to a fixed potential while other electrodes of the array of electrodes are active electrodes that are driven and sensed, to measure combined mutual- and self-capacitance of the active electrodes.

In an exemplary embodiment of the touch panel display device, the first conductive data lines in the first direction are operated to drive the array of electrodes, and the second conductive data lines in the second direction are operated to sense the array of electrodes.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The present invention relates to capacitive sensing arrays. In particular, this invention relates to capacitive type touch panels. Such a capacitive type touch panel device may find application in a range of consumer electronic products including, for example, mobile phones, tablet and desktop PCs, electronic book readers and digital signage products.

What is claimed is:

1. A capacitive sensing array comprising:
an array of electrodes;
first conductive data lines arranged in a first direction and second conductive data lines arranged in a second direction different from the first direction;
first switching elements configured to connect each electrode to a first conductive data line in the first direction, and second switch elements configured to connect each electrode to a second conductive data line in the second direction; and
control lines connected to the first and second switching elements;
wherein electrical connections are present between each first conductive data line in the first direction and a second conductive data line in the second direction such that each first conductive data line in the first direction is electrically connected to at least one second conductive data line in the second direction.

2. The capacitive sensing array of claim 1, wherein sub-sets of the control lines connected to the switching elements are connected together by common control lines.

3. The capacitive sensing array of claim 2, wherein there are two common control lines.

4. The capacitive sensing array of claim 1, wherein multiplexing switches are provided that connect the second conductive data lines arranged in the second direction to drive and sense connections of a touch panel controller.

5. The capacitive sensing array of claim 4, wherein the multiplexing switches further connect the second conductive data lines arranged in the second direction to another voltage.

6. The capacitive sensing array of claim 5, wherein the another voltage comprises a ground voltage or another fixed DC voltage.

7. The capacitive sensing array of claim 4, wherein the multiplexing switches comprise thin film transistors (TFTs).

8. The capacitive sensing array of claim 7, wherein the TFTs are located in a lower bezel area of an active matrix touch sensor panel.

9. The capacitive sensing array of claim 4, wherein the multiplexing switches comprise CMOS transistors.

10. The capacitive sensing array of claim 9, wherein the CMOS transistors are located within a touch panel controller.

11. A touch panel display device comprising: the capacitive sensing array of claim 1, wherein the capacitive sensing array is implemented as an active matrix touch sensor panel integrated with a display; and wherein the electrode array is formed from a VCOM electrode of the display, and each of the first and second switching elements comprise one or more TFTs.

12. The touch panel display device of claim 11, wherein the one or more TFTs are distributed within an active area of the display.

13. The touch panel display device of claim 11, further comprising a touch panel controller that is configured to apply drive signals to one or more of the second conductive data lines arranged in the second direction during a first time period, and to measure signals on the one or more second conductive data lines during a second time period.

14. The touch panel display device of claim 13, wherein the controller is configured to measure signals comprising charge or current measurements.

15. The touch panel display device of claim 13, further comprising a control signal generator that is configured to apply control signals to the control lines that cause the electrodes to be connected to the first conductive data line in the first direction during the first time period, and to be connected to the second conductive data line in the second direction during the second time period.

16. The touch panel display device according to claim 13, wherein the drive signals form a fully or partially orthogonal code.

17. The touch panel display device of claim 13, wherein the touch panel controller is configured to measure a self-capacitance of each electrode in the array of electrodes.

18. The touch panel display device of claim 11, where a portion of the electrodes of the array of electrodes are connected to ground or to a fixed potential while other electrodes of the array of electrodes are active electrodes that are driven and sensed, to measure combined mutual- and self-capacitance of the active electrodes.

19. The touch panel display device of claim 11, wherein the first conductive data lines in the first direction are operated to drive the array of electrodes, and the second conductive data lines in the second direction are operated to sense the array of electrodes.

* * * * *